(12) United States Patent
Fukuro et al.

(10) Patent No.: US 8,901,618 B2
(45) Date of Patent: Dec. 2, 2014

(54) SOLID-STATE IMAGE PICKUP ELEMENT, METHOD OF MANUFACTURING THE SAME, AND ELECTRONIC APPARATUS

(71) Applicant: Sony Corporation, Tokyo (JP)

(72) Inventors: Taketo Fukuro, Kanagawa (JP); Jun Okuno, Kanagawa (JP)

(73) Assignee: Sony Corporation, Tokyo (JP)

(*) Notice: Subject to any disclaimer, the term of this patent is extended or adjusted under 35 U.S.C. 154(b) by 0 days.

(21) Appl. No.: 13/972,351

(22) Filed: Aug. 21, 2013

(65) Prior Publication Data

US 2013/0341684 A1    Dec. 26, 2013

Related U.S. Application Data

(63) Continuation of application No. 13/050,362, filed on Mar. 17, 2011, now Pat. No. 8,530,945.

(30) Foreign Application Priority Data

Mar. 26, 2010 (JP) ................... 2010-072498

(51) Int. Cl.
*H01L 31/0216* (2014.01)
*H01L 31/0232* (2014.01)
*H01L 27/148* (2006.01)
*H01L 27/146* (2006.01)

(52) U.S. Cl.
CPC .... *H01L 27/14887* (2013.01); *H01L 27/14612* (2013.01); *H01L 27/14623* (2013.01); *H01L 27/14689* (2013.01)
USPC ....................................... 257/229

(58) Field of Classification Search
CPC ............ H01L 27/14623; H01L 27/1461; H01L 27/14685; H01L 27/14818
USPC ........................ 438/60, 71, 72, 78; 257/229
See application file for complete search history.

(56) References Cited

U.S. PATENT DOCUMENTS 5,492,852 A    2/1996 Minami
7,084,000 B2 *  8/2006 Iwawaki ................... 438/60
(Continued)

FOREIGN PATENT DOCUMENTS

JP    63-170959    7/1988
JP    03-253076    11/1991
(Continued)

OTHER PUBLICATIONS

Japanese Office Action issued in connection with the related Japanese Patent Application No. 2010-072498 dated Feb. 4, 2014.

*Primary Examiner* — George Fourson, III
(74) *Attorney, Agent, or Firm* — Dentons US LLP

(57) ABSTRACT

A solid-state imaging device, including a semiconductor substrate; a photoelectric conversion region in the semiconductor substrate that generates charges in response to light incident thereon; an electric charge holding region in the semiconductor substrate and capable of holding electric charges accumulated in the photoelectric conversion region until the electric charges are read out from the electric charge holding region; a transfer gate that effects transfer of electric charges generated in the photoelectric conversion region to the electric charge holding region; a light blocking film over an upper surface of the transfer gate; and an insulating layer over the substrate and between the semiconductor substrate and the light blocking film, wherein, a portion of the insulating layer over the photoelectric conversion region is more thinly formed than the insulating layer not over the photoelectric conversion region.

19 Claims, 17 Drawing Sheets

(56) References Cited

U.S. PATENT DOCUMENTS

| | | |
|---|---|---|
| 7,135,725 B2 * | 11/2006 | Kato .............................. 257/291 |
| 7,572,571 B2 | 8/2009 | Moon |
| 7,675,096 B2 | 3/2010 | Takahashi et al. |
| 7,847,361 B2 | 12/2010 | Kokusenya |
| 7,847,366 B2 | 12/2010 | Rhodes et al. |
| 2005/0098806 A1 | 5/2005 | Rhodes |
| 2006/0141661 A1 | 6/2006 | Park et al. |
| 2007/0012966 A1 | 1/2007 | Park |
| 2007/0080424 A1 | 4/2007 | Rhodes et al. |
| 2008/0102551 A1 | 5/2008 | Park et al. |
| 2009/0206429 A1 | 8/2009 | Rhodes et al. |
| 2009/0230490 A1 | 9/2009 | Yokozawa |
| 2011/0177640 A1 | 7/2011 | Han et al. |
| 2011/0233707 A1 | 9/2011 | Fukuro et al. |
| 2011/0291214 A1 * | 12/2011 | Nam et al. .................... 257/432 |
| 2012/0188431 A1 * | 7/2012 | Takimoto ..................... 348/311 |

FOREIGN PATENT DOCUMENTS

| | | |
|---|---|---|
| JP | 07-122721 | 5/1995 |
| JP | 2007-157912 | 6/2007 |
| JP | 2008-103647 | 5/2008 |

* cited by examiner

ELECTRIC CHARGE
DETECTING PORTION

SOLID-STATE IMAGE PICKUP ELEMENT, METHOD OF MANUFACTURING THE SAME, AND ELECTRONIC APPARATUS

RELATED APPLICATION DATA

This application is a continuation of U.S. patent application Ser. No. 13/050,362 filed Mar. 17, 2011, the entirety of which is incorporated herein by reference to the extent permitted by law. The present application claims the benefit of priority to Japanese Patent Application No. JP 2010-072498 filed on Mar. 26, 2010 in the Japan Patent Office, the entirety of which is incorporated by reference herein to the extent permitted by law.

BACKGROUND OF THE INVENTION

1. Field of the Invention

The present invention relates to a solid-state image pickup element and a method of manufacturing the same, and an electronic apparatus. More particularly, the invention relates to a solid-state image pickup element which makes it possible to suppress coloring due to a locus-like noise caused when an image of a moving high-luminance subject is captured and a method of manufacturing the same, and an electronic apparatus using the same.

2. Description of the Related Art

Although many CMOS (Complementary Metal Oxide Semiconductor) image sensors include an electronic shutter function, a rolling shutter (focal-plane shutter) is a basis in the CMOS image sensor. In the rolling shutter, multiple pixels two-dimensionally arranged are successively scanned every pixel row to reset a signal. Therefore, a period of time for an exposure operation is shifted every screen row. As a result, in the case where a subject is moving, or the like, a distortion is generated in a captured image. For example, when a subject extending straight in a vertical direction moving in a transverse direction is photographed, the subject is photographed just as if the subject is inclined.

In order to cope with such a situation, a full-pixel simultaneous electronic shutter for a CMOS high-speed image sensor has been developed. The full-pixel simultaneous electronic shutter is such that an exposure operation is simultaneously started about all the pixels effective in image capturing, and the exposure operation is simultaneously ended, and is called a global shutter (global exposure) as well.

FIG. 1 shows a pixel structure of a CMOS image sensor (solid-state image pickup element) which can carry out a full-pixel simultaneous electronic shutter operation proposed in Japanese Patent Laid-Open No. 2008-103647 (refer to FIG. 3).

The solid-state image pickup element shown in FIG. 1 has a semiconductor region 1 of a first conductivity type (P-type), and a surface buried region 11a of a second conductivity type (N-type) for receiving a light. In this case, the surface buried region 11a of the second conductivity type (N-type) for receiving a light is buried in a part of an upper portion of the semiconductor region 1 in order to receive a light made incident thereto. In addition, an electric charge holding region 12a of the second conductivity type ($N^+$-type) is disposed in a part of the upper portion of the semiconductor region 1, that is, a position laterally located away from the surface buried region 11a for receiving a light. In this case, the electric charge holding region 12a of the second conductivity type ($N^+$-type) holds signal electric charges generated by the surface buried region 11a for receiving a light. In addition, an electric charge reading region 13 of the second conductivity type ($N^+$-type) is disposed in a part of the upper portion of the semiconductor region 1, that is, in a position laterally located away from the electric charge holding region 12a. In this case, the electric charge reading region 13 of the second conductivity type ($N^+$-type) receives the signal electric charges held by the electric charge holding region 12a. It is noted that the electric charge holding region 12a is deeper in potential well than the surface buried region 11a for receiving a light.

In addition, a transfer gate electrode 31 is disposed on an insulating film 2. In this case, with the transfer gate electrode 31, a potential of a first transfer channel formed between the surface buried region 11a for receiving a light and the electric charge holding region 12a is controlled, thereby transferring the signal electric charges from the surface buried region 11a for receiving a light to the electric charge holding region 12a. In addition, a reading gate electrode 32 is disposed on the insulating film 2. In this case, with the reading gate electrode 32, a potential of the second transfer channel formed between the electric charge holding region 12a and the electric charge reading region 13 is controlled, thereby transferring the signal electric charges from the electric charge holding region 12a to the electric reading region 13.

A light blocking film 41 is provided above the electric charge holding region 12a in order to prevent a light from being leaked to the electric charge holding region 12a to add a signal while the signal electric charges are held in the electric charge holding region 12a.

A photodiode D1 is composed of the surface buried region 11a for receiving a light serving as a cathode region, and the semiconductor substrate 1 serving as an anode region and provided right below the surface buried region 11a for receiving a light. Likewise, an electric charge accumulating diode D2 is composed of the electric charge holding region 12a serving as the cathode region and the semiconductor substrate 1 serving as the anode region and provided right below the electric charge holding region 12a. Also, a $P^+$-type pinning layer 11b is provided so as to overlie the surface buried region 11a for receiving a light, and a $P^+$-type pinning layer 12b is provided so as to overlie the electric charge holding region 12a.

The photodiode D1 receives a pulse light made incident thereto through an opening portion of the light blocking film 41 in the form of an optical signal, and converts the resulting optical signal into signal electric charges. A high voltage is applied to the transfer gate electrode 31 simultaneously for all pixels, whereby the signal electric charges generated by the surface buried region 11a for receiving a light are perfectly transferred to the electric charge holding region 12a. A high voltage is applied to the reading gate electrode 32, whereby the signal electric charges held in the electric charge holding region 12a are successively transferred to the electric charge reading region 13.

As has been described, in the CMOS image sensors which can carry out the full-pixel simultaneous electronic shutter operation, the electric charge holding region 12a is provided every pixel.

Here, in the case where the light blocking property of the light blocking film 41 is insufficient, when a light is received from a high luminance subject while the signal electric charges are held in the electric charge holding region 12a, a signal is leaked to the electric charge holding region 12a to turn into a noise. In addition, when the subject is moving, a noise is generated so as to have a locus-like shape along which the subject has moved (hereinafter referred to as "a locus-like noise").

FIG. 2 shows a structure of a CMOS image sensor having the pixel having the structure shown in FIG. 1.

A color filter (not shown) for passing only a light in a wavelength region corresponding to any one of Red (R), Green (G) and Blue (B) is disposed on an upper portion of each of the pixels. In FIG. 2, colors of the color filters of the respective pixels are indicated by characters R, G and B. It is noted that a pixel arrangement of the R, G and B pixels shown in FIG. 2 is an example of a Bayer arrangement. When the high luminance subject moves for such a pixel arrangement of the R, G and B pixels as indicated by a block arrow represented by a heavy solid line, a ratio of an amount of signal electric charges, and an amount of signal electric charges leaked (leaked signal suppression ratio) differs among the R, G and B pixels. In FIG. 2, a black arrow represented by a light solid line indicates a flow of the leaked electric charges, and a black arrow represented by a light dotted line indicates the noise.

Since the leaked signal suppression ratio differs among the R, G and B pixels, a color caused by the locus-like noise generated becomes a color different from that of the subject. With regard to a concrete example, the locus-like noise whose color is seen when a white LED (Light Emitting Diode) light bulbs as the high luminance subject moves is outputted so as not to have a white color, but is outputted so as to have a color like an orange color.

FIG. 3 shows an example of a structure of a CCD (Charge-Couple Device) image sensor corresponding to the structure shown in FIG. 2.

In the CCD image sensor, the electrons generated in a photodiode by photoelectric conversion are transferred simultaneously for all the pixels to a vertical transfer register common either in a longitudinal direction or in a transverse direction to be read out in a line-sequential manner. Therefore, the electric charges generated in a portion, having a high luminance, of the high luminance subject turn into a streak-like noise (smear). In this case, since the electric charges leaked from the R, G and B pixels are mixed in the common vertical transfer register, which of the R, G and B pixels an amount of electric charges are leaked to is not distinguished. Therefore, a problem about the coloring due to the leaked light like the CMOS image sensor is not caused.

Some CCD image sensors are intended to reduce the leaked light. For example, as shown in FIG. 4A, Japanese Patent Laid-Open No. Hei 7-122721 (refer to FIG. 2) proposes a technique such that a thickness X of the gate insulating film 53 formed between an n-type region 51 serving as a photoelectric conversion portion, and a light blocking film 52 is reduced, thereby reducing a quantity of leaked light. As shown in FIG. 4B, as the thickness X of the gate insulating film 53 is reduced, a quantity of leaked light is reduced, and a smear level is also reduced.

SUMMARY OF THE INVENTION

With the technique proposed in Japanese Patent Laid-Open No. Hei 7-122721, in the R, G and B pixels, the thicknesses X of the gate insulating films 53 are uniformly reduced.

Heretofore, as one of the causes by which the leaked signal suppression ratio differs among the R, G and B pixels, it is given that although the incident lights are lights having different wavelengths corresponding to R, G and B, the structures of the R, G and B pixels are set as being identical to one another.

That is to say, (1) a light absorption coefficient of a semiconductor (silicon) differs depending on the wavelengths of the lights. Therefore, with regard to the lights of R, G and B, it is easy to cause the photoelectric conversion even in a deep portion from a surface of a semiconductor substrate in the order of R, G and B. As a result, the photoelectric conversion is easily caused in a portion other than an N-type region composing a photodiode.

(2) A light is easy to diffract as a wavelength of the light is longer. Therefore, the lights of R, G and B are easy to diffract in the order of R, G and B. As a result, the photoelectric conversion is easily caused in a portion other than the N-type region composing the photodiode as the wavelength of the light becomes longer.

Therefore, when as proposed in Japanese Patent Laid-Open No. Hei 7-122721, in the R, G and B pixels, the thicknesses X of the gate insulating films 53 are uniformly reduced, it may be impossible to suppress the coloring caused by the locus-like noise in the CMOS image sensor.

The present invention has been made in order to solve the problems described above, and it is therefore desirable to provide a solid-state image pickup element in which coloring of a locus-like noise when an image of a moving high luminance subject is captured can be suppressed and a method of manufacturing the same, and an electronic apparatus using the same.

In order to attain the desire described above, according to a first embodiment of the present invention, there is provided a solid-state image pickup element including: a photoelectric conversion region formed in a semiconductor substrate; an electric charge holding region formed in the semiconductor substrate for holding electric charges accumulated in the photoelectric conversion region until the electric charges are read out; a transfer gate formed on the semiconductor substrate for transferring the electric charges generated in the photoelectric conversion region by photoelectric conversion to the electric charge holding region; and a light blocking film formed on an upper surface of the transfer gate, in which a portion between the semiconductor substrate and the light blocking film is thinly formed as a light made incident to the photoelectric conversion region has a longer wavelength in a wavelength region.

According to a second embodiment of the present invention, there is provided a method of manufacturing a solid-state image pickup element including the steps of: forming a photoelectric conversion region for converting an incident light into electric charges and an electric charge holding region for holding the electric charges accumulated in the photoelectric conversion region until the electric charges are read out in a semiconductor substrate, and forming a transfer gate for transferring the electric charges generated in the photoelectric conversion region by the photoelectric conversion to the electric charge holding region on the semiconductor substrate; and forming an insulating film on the semiconductor substrate and the transfer gate in such a way that the insulating film becomes thin as a light made incident to the photoelectric conversion region has a longer wavelength in a wavelength region.

According to a third embodiment of the present invention, there is provided an electronic apparatus having a solid-state image pickup element including: a photoelectric conversion region formed in a semiconductor substrate; an electric charge holding region formed in the semiconductor substrate for holding electric charges accumulated in the photoelectric conversion region until the electric charges are read out; a transfer gate formed on the semiconductor substrate for transferring the electric charges generated in the photoelectric conversion region by photoelectric conversion to the electric charge holding region; and a light blocking film formed on an upper surface of the transfer gate, in which a portion between the semiconductor substrate and the light blocking film is thinly formed as a light made incident to the photoelectric conversion region has a longer wavelength in a wavelength region, and unit pixels in plural rows disposed in a matrix carry out simultaneously accumulation of the electric charges, and the electric charges transferred by the transfer gate are successively read out.

In the first to third embodiments of the present invention, the portion between the semiconductor substrate and the light blocking film is thinly formed as the light made incident to the photoelectric conversion region has the longer wavelength in the wavelength region.

According to the first and third embodiments of the present invention, it is possible to suppress the coloring due to the locus-like noise caused when the image of the moving high luminance subject is captured.

In addition, according to the second embodiment of the present invention, it is possible to manufacture the solid-state image pickup element in which the coloring due to the locus-like noise caused when the image of the moving high luminance subject is captured is suppressed.

According to a fourth embodiment of the present invention, there is provided a solid-state image pickup element including: a first photoelectric conversion region for receiving a light having a first wavelength, thereby carrying out photoelectric conversion; a second photoelectric conversion region for receiving a light having a shorter wavelength than the first wavelength of the light, thereby carrying out the photoelectric conversion; a first transfer gate for transferring electric charges generated in the first photoelectric conversion region by the photoelectric conversion; a second transfer gate for transferring the electric charges generated in the second photoelectric conversion region by the photoelectric conversion; an electric charge holding region for holding the electric charges transferred thereto through the first transfer gate and/or the second transfer gate; and a light blocking film formed on at least an upper surface of a part of the first photoelectric conversion region and the second photoelectric conversion region, and an upper surface of the transfer gate, in which a portion between the semiconductor substrate and the light blocking film in the first photoelectric conversion region is more thinly formed than a portion between the semiconductor substrate and the liquid blocking film.

DETAILED DESCRIPTION OF THE PREFERRED EMBODIMENTS

The preferred embodiments of the present invention will be described in detail hereinafter with reference to the accompanying drawings.

[Configuration of CMOS Image Sensor]

Figure 1:
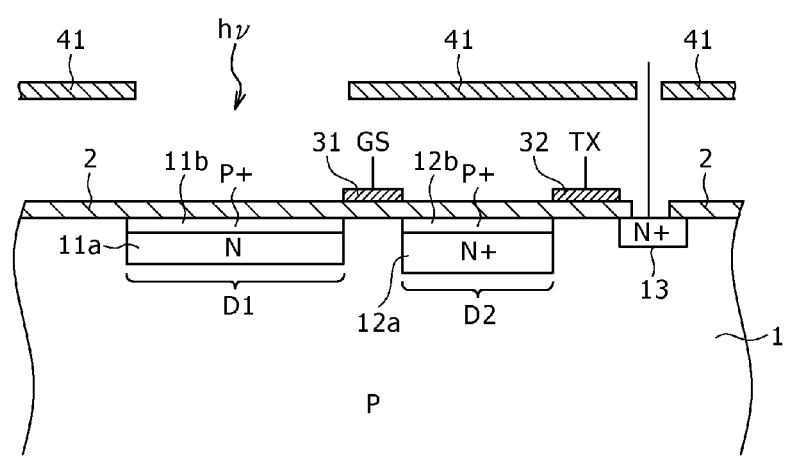
FIG. 1 is a cross sectional view showing an example of a structure of an existing CMOS image sensor.
Figure 2:
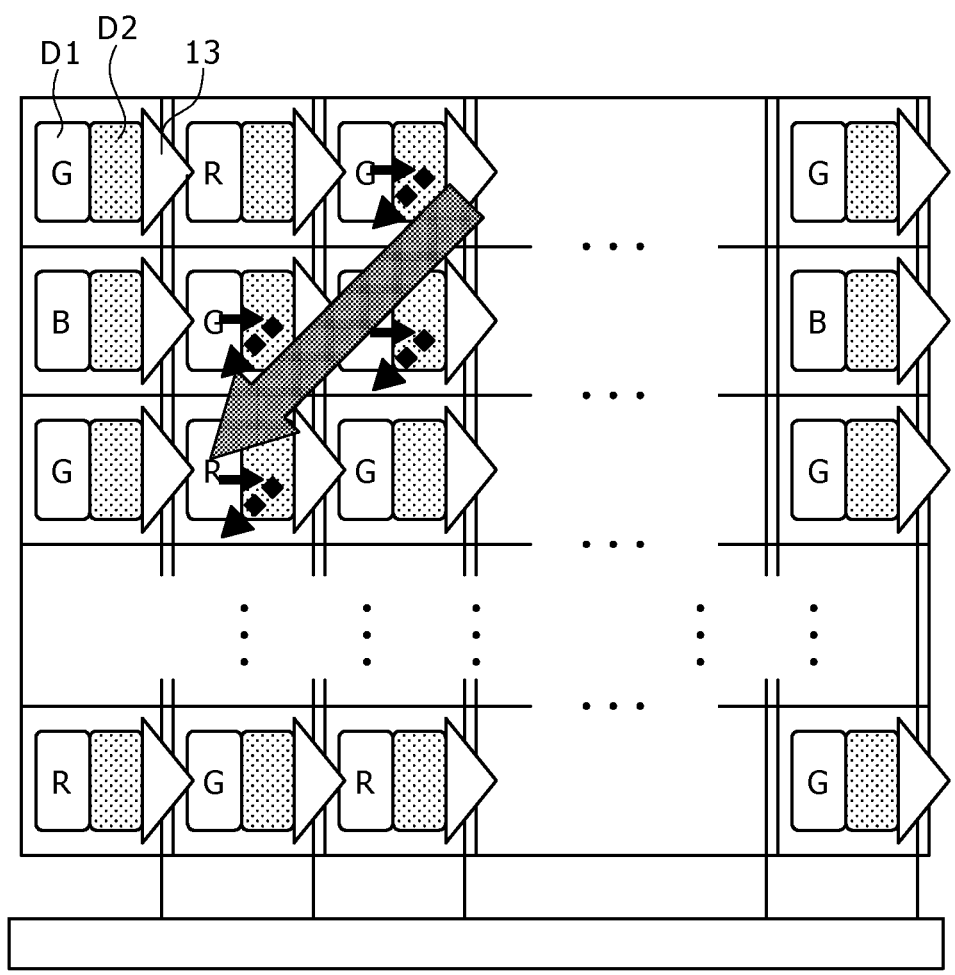
FIG. 2 is a top plan view showing a structure of the existing CMOS image sensor.
Figure 3:
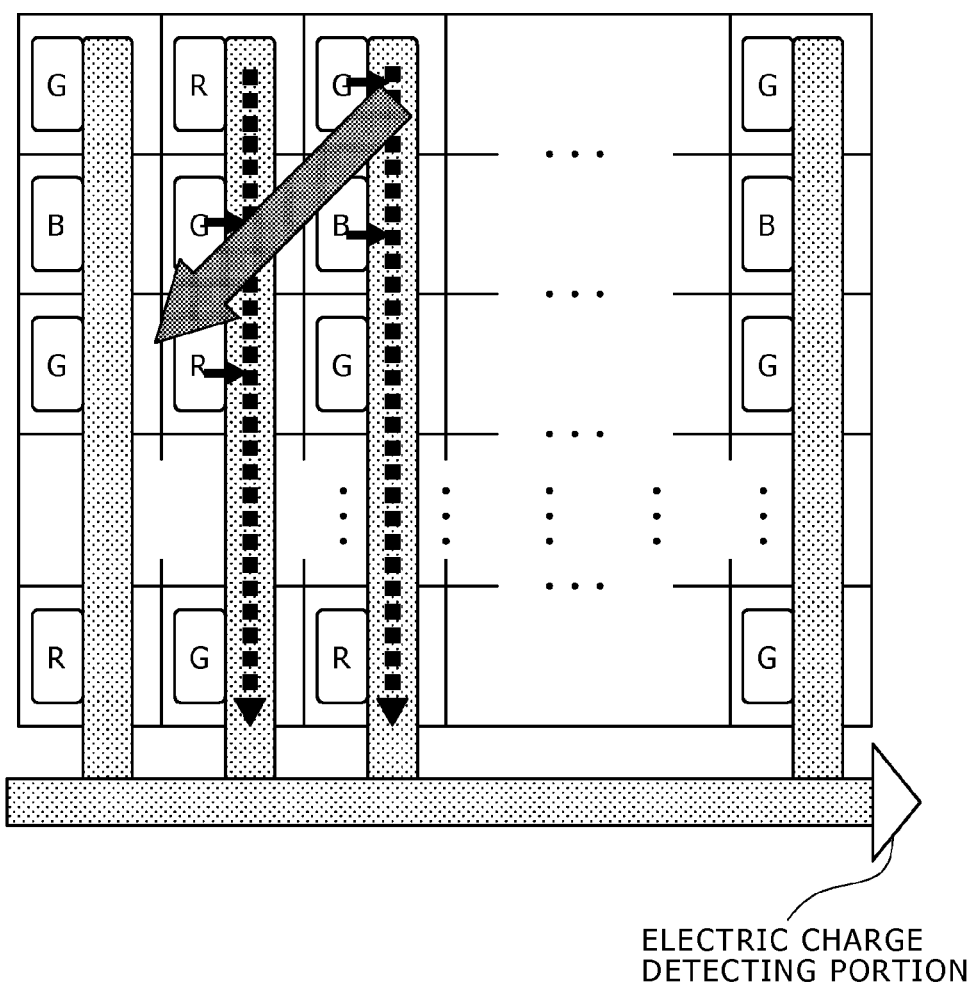
FIG. 3 is a top plan view showing a structure of an existing CCD image sensor.
Figure 4A:
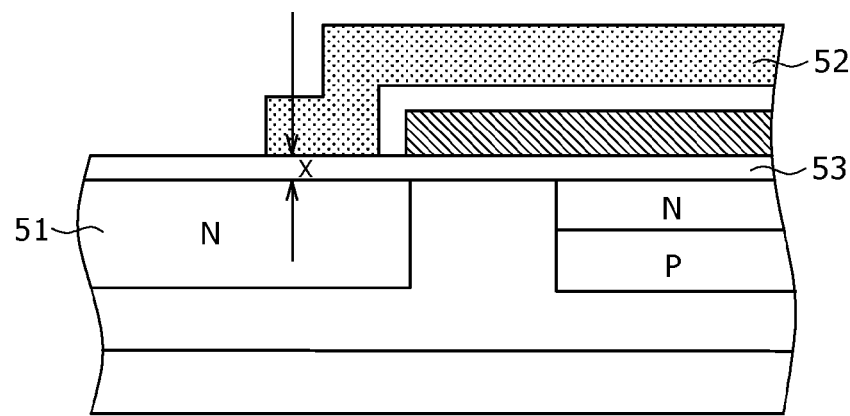
FIGS. 4A and 4B are a cross sectional view explaining the related art of the existing CCD image sensor, and a graph showing a relationship between a thickness of a gate insulating film of the existing CCD image sensor, and a smear level, respectively.
Figure 4B:
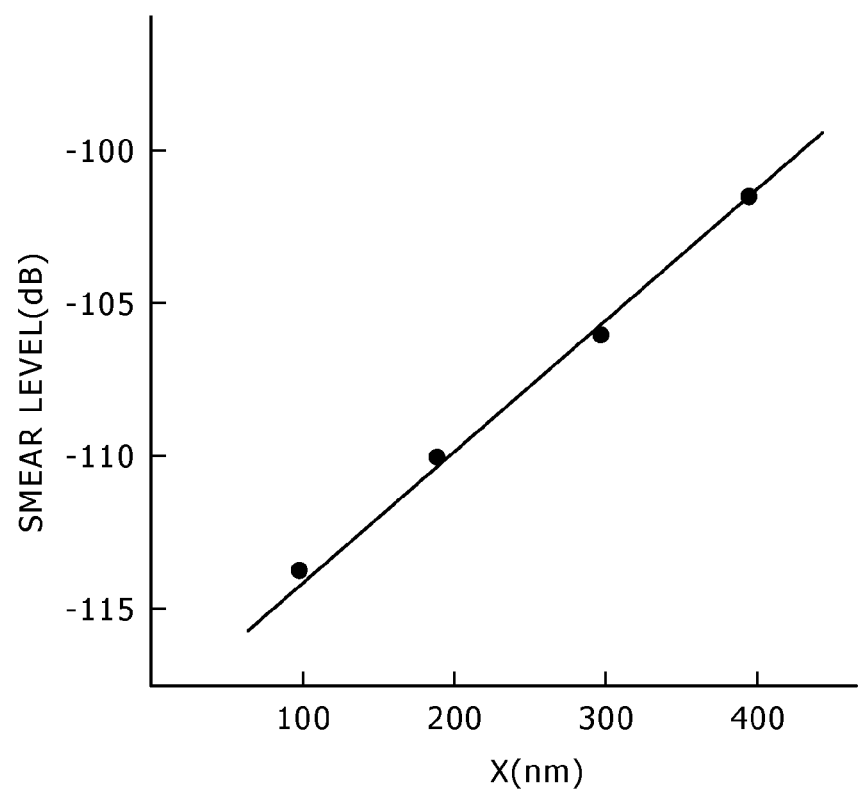
Figure 5:
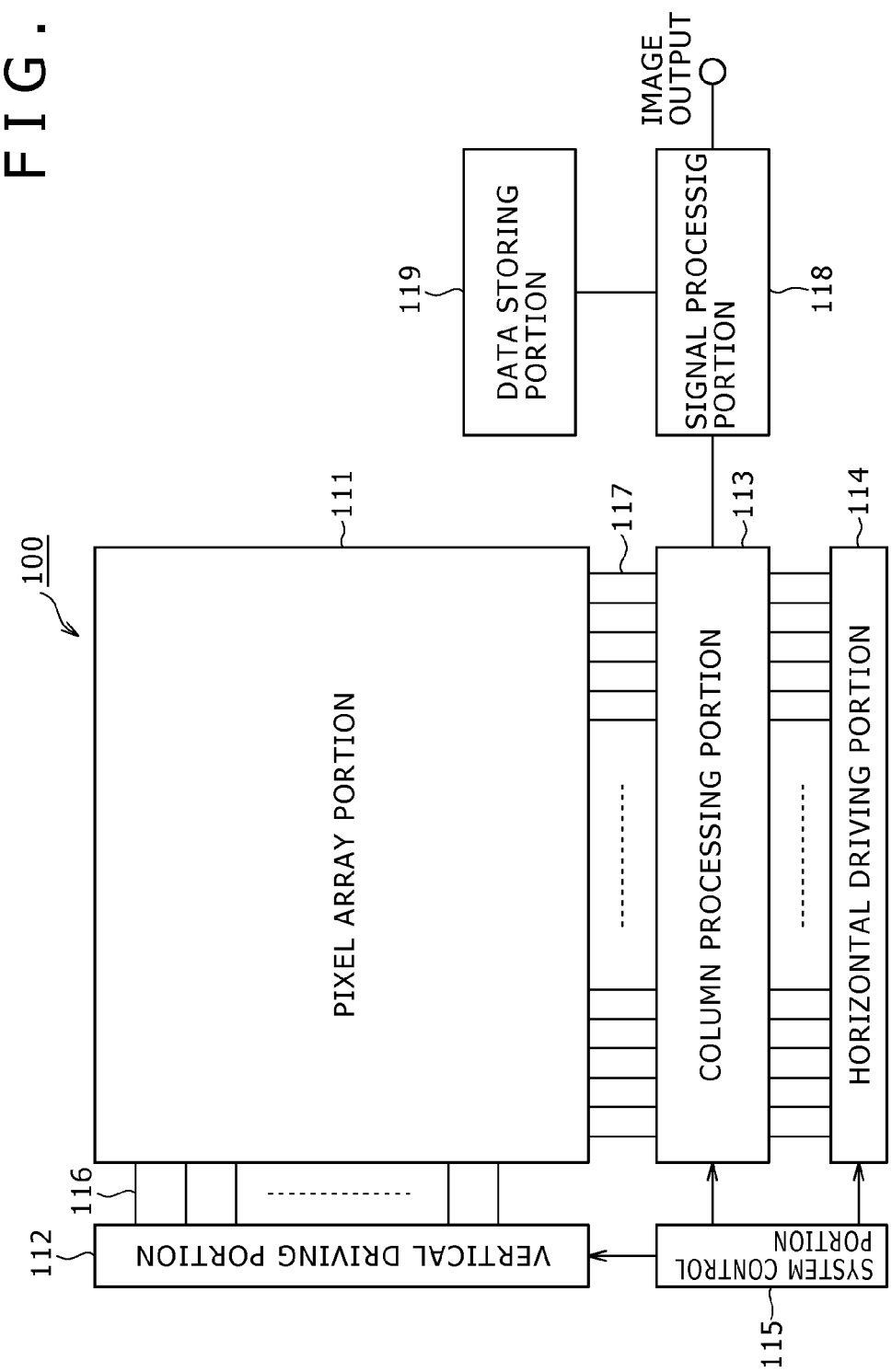
FIG. 5 is a block diagram showing a configuration of a solid-state image pickup element according to an embodiment of the present invention.

FIG. 5 is a block diagram showing a configuration of a CMOS image sensor as a solid-state image pickup element according to an embodiment of the present invention.

The CMOS image sensor 100 includes a pixel array portion 111, a vertical driving portion 112, a column processing portion 113, a horizontal driving portion 114, and a system control portion 115. The pixel array portion 111, the vertical driving portion 112, the column processing portion 113, the horizontal driving portion 114, and the system control portion 115 are all formed on a semiconductor substrate (chip) (not shown).

Unit pixels (each typified by a unit pixel 120 shown in FIG. 6) each having a photoelectric conversion element for generating optical electric charges corresponding to a quantity of incident light, and accumulating the optical electric charges in its inside are two-dimensionally disposed in a matrix in the pixel array portion 111. It is noted that in the following description, the optical electric charges corresponding to a quantity of incident light is described simply as "the electric charges," and the unit pixel is described simply as "the pixel" in some cases.

In addition, in the pixel array portion 111, a pixel driving line 116 is formed along a horizontal direction (along an arrangement direction of the pixels in a pixel row) of FIG. 5 every row for the matrix-like pixel arrangement. Also, a vertical signal line 117 is formed along a vertical direction (along an arrangement direction of the pixels in a pixel column) of FIG. 5 every column. Although in FIG. 5, one pixel driving line 116 is illustrated per row, the present invention is by no means limited thereto. One end of the pixel driving line 116 is connected to corresponding one of output ends corresponding to output ends of the vertical driving portion 112, respectively.

The CMOS image sensor 100 further includes a signal processing portion 118 and a data storing portion 119. Processing in the signal processing portion 118 and the data storing portion 119 may be realized by an external signal processing portion provided in a substrate different from that of the CMOS image sensor 100, for example, a Digital Signal Processor (DSP) or software. Or, the signal processing portion 118 and the data storing portion 119 may be mounted on the same substrate as that of the CMOS image sensor 100.

The vertical driving portion 112 is composed of a shift register, an address decoder and the like. Thus, the vertical driving portion 112 is a pixel driving portion for driving the pixels in the pixel array portion 111 in a full-pixel simultaneous manner, or with a row as a unit, with plural pixels as a unit, or the like. Although a concrete configuration of the vertical driving portion 112 is omitted in illustration thereof, in general, the vertical driving portion 112 is configured so as to have two scanning systems of a reading scanning system and a sweeping and scanning system.

The reading and scanning system successively selects and scans the unit pixels in the pixel array portion 111 with the row as a unit in order to read out the signals from the unit pixels, respectively. The sweeping and scanning system carries out the sweeping and scanning operations ahead of the reading and scanning operations by a period of time for a shutter speed for the row, as an object of the reading, for which the reading and scanning operations are carried out by the reading and scanning system.

By carrying out the sweeping and scanning operations by the sweeping and scanning system, the unnecessary electric charges are swept (reset) from the photoelectric conversion elements of the unit pixels in the row as an object of the reading. Also, by the sweeping (resetting) of the unnecessary electric charges by the sweeping and scanning system, a so-called electronic shutter operation is carried out. Here, the electronic shutter operation means an operation for discarding the optical electric charges accumulated in the photoelectric conversion elements, thereby starting newly the exposure operation (starting the accumulation of the optical electric charges).

The signals read out by the reading operation by the reading and scanning system correspond to a quantity of light made incident in and after the reading operation right before that reading operation by the reading and scanning system or the electronic shutter operation. Also, a period of time ranging from either a reading timing for the right-before reading operation or a sweeping timing for the electronic shutter operation to a reading timing for this reading operation become a period of time for accumulation of the optical electric charges in the unit pixel (a period of time for the exposure operation).

The pixel signals outputted from the respective unit pixels, in the pixel row, which are selected and scanned by the vertical driving portion 112 are supplied to the column processing portion 113 through the respective vertical signal lines 117. The column processing portion 113 executes predetermined signal processing for the pixel signals outputted from the respective unit pixels in the selected row through the respective vertical signal lines 117 every pixel column in the pixel array portion 111, and also temporarily holds the pixel signals after completion of the signal processing.

Specifically, the column processing portion 113 executes at least noise removal processing, for example, Correlated Double Sampling (CDS) processing as the signal processing. A reset noise, and a fixed pattern noise inherent in the pixel caused by the dispersion of the threshold value of an amplification transistor are removed by executing the CDS processing by the column processing portion 113. It is also possible that the column processing portion 113 is given an Analog-to-Digital (A/D) conversion function in addition to the noise removal processing, and thus the signal level is outputted in the form of a digital signal.

The horizontal driving portion 114 is composed of a shift register, an address decoder and the like, and selects unit circuits, in order, corresponding to the pixel column in the column processing portion 113. The pixel signals which have been subjected to the signal processing in the column processing portion 113 are outputted in order to the signal processing portion 118 in accordance with the selecting and scanning operations by the horizontal driving portion 114.

The system control portion 115 is composed of a timing generator for generating various kinds of timing signals, and the like, and carries out the drive control for the vertical driving portion 112, the column processing portion 113, the horizontal driving portion 114, and the like in accordance with the various kinds of timing signals generated by the timing generator.

The signal processing portion 118 has at least an addition processing function, and executes various kinds of signal processing such as addition processing for the pixel signals outputted from the column processing portion 113. The data storing portion 119 temporarily stores data necessary for the signal processing when that signal processing is executed in the signal processing portion 118.

[Structure and Configuration of Unit Pixel]

Next, a description will be given with respect to a concrete structure and configuration of each of the unit pixels 120 disposed in a matrix in the pixel array portion 111. The unit pixel 120 has an electric charge holding region (hereinafter referred to as "a memory portion") for holding the optical electric charges transferred thereto from the photoelectric conversion element separately from a Floating Diffusion (FD) region (capacitor).

Figure 6:
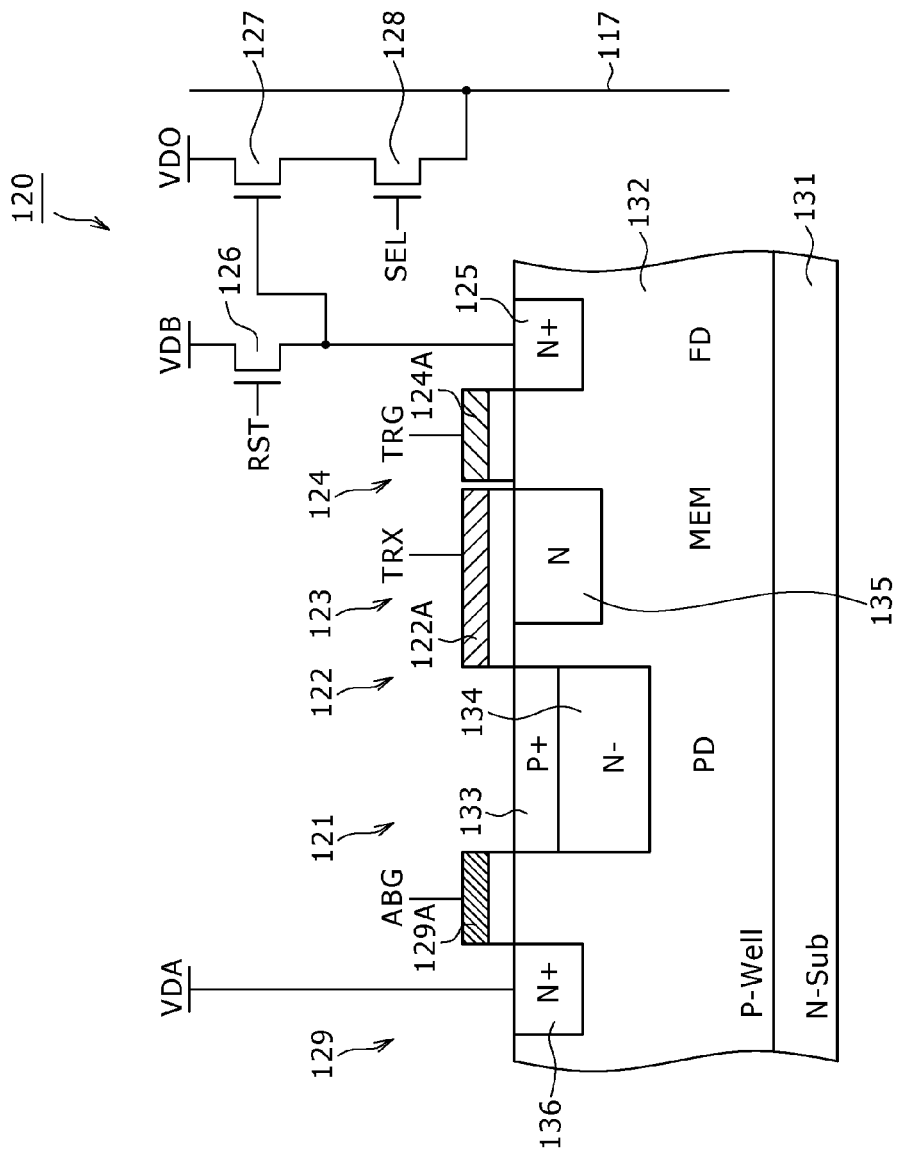
FIG. 6 is a cross sectional view, partly in circuit, showing a structure and a configuration of a unit pixel.

FIG. 6 is a cross sectional view, partly in circuit, showing the structure and configuration of the unit pixel 120.

The unit pixel 120, for example, has a photodiode (PD) 121 as a photoelectric conversion element. The photodiode 121 is a buried photodiode. In this case, for example, a P-type layer 133 is formed on a substrate surface side and an N-type buried layer 134 is buried in a P-type well layer 132 formed in the N-type substrate 131, thereby forming the photodiode 121.

The unit pixel 120 has a first transfer gate 122, a memory portion (MEM) 123, a second transfer gate 124, and a Floating Diffusion (FD) region 125 in addition to the photodiode 121. It is noted that as will be described later with reference to FIG. 7 and the like, a light is blocked for both the memory portion 123 and the floating diffusion region 125.

The first transfer gate 122 transfers the electric charges generated in the photodiode 121 by the photoelectric conversion and accumulated in the inside of the photodiode 121 by applying a transfer pulse TRX to a gate electrode 122A. The memory portion 123 is composed of an N-type buried channel 135 formed below the gate electrode 122A, and holds the electric charges transferred thereto from the photodiode 121 by the first transfer gate 122. Since the memory portion 123 is composed of an N-type buried channel 135, it is possible to suppress the generation of a dark current in a substrate interface, which can contribute to the enhancement of the image quality.

In the memory portion 123, the gate electrode 122A is disposed on an upper portion of the memory portion 123, and a transfer pulse TRX is applied to the gate electrode 122A, thereby making it possible to modulate the memory portion 123. That is to say, the transfer pulse TRX is applied to the gate electrode 122A, whereby a potential of the memory portion 123 becomes deep. As a result, an amount of saturated electric charges in the memory portion 123 can be further increased in the case where the memory portion 123 is modulated than in the case where the memory portion 123 is not modulated.

The second transfer gate 124 transfers the electric charges held in the memory portion 123 by applying a transfer pulse TRG to the gate electrode 124A thereof. The floating diffusion area 125 is a charge-to-voltage converting portion composed of an N-type layer, and thus converts the electric charges transferred thereto from the memory portion 123 by the second transfer gate 124 into a voltage.

The unit pixel 120 further has a reset transistor 126, an amplification transistor 127, and a selection transistor 128. In the case shown in FIG. 6, each of the reset transistor 126, the amplification transistor 127, and the selection transistor 128 is composed of an N-channel MOS transistor. However, a combination of the conductivity types of the reset transistor 126, the amplification transistor 127, and the selection transistor 128 which are exemplified in FIG. 6 is merely an example, and thus the present invention is by no means limited to this combination of the conductivity types.

The reset transistor 126 is connected between a power source VDB and the floating diffusion region 125, and resets the floating diffusion region 125 by applying a reset pulse RST to a gate electrode thereof. A drain electrode of the amplification transistor 127 is connected to a power source VDO, and a gate electrode of the amplification transistor 127 is connected to the floating diffusion region 125. Thus, the amplification transistor 127 reads out a voltage of the floating diffusion region 125.

For example, a drain electrode of the selection transistor 128 is connected to a source electrode of the amplification transistor 127, and a source electrode of the selection transistor 128 is connected to the vertical signal line 117. Thus, the selection transistor 128 selects the unit pixel 120 from which the pixel signal is to be read out by applying a selection pulse SEL to a gate electrode thereof. It is noted that with regard to the selection transistor 128, it is possible to adopt such a configuration that the selection transistor 128 is connected between a power source VDO and the drain electrode of the amplification transistor 127.

One or plural ones of the reset transistor 126, the amplification transistor 127, and the selection transistor 128 can be omitted by using a method of reading the pixel signals, or can be shared among plural pixels.

The unit pixel 120 further has an electric charge discharging portion 129 for discharging the electric charges accumulated in the photodiode 121. The electric charge discharging portion 129 discharges the electric charges accumulated in the photodiode 121 to a drain portion 136 composed of the N$^+$-type layer by applying a control pulse ABG to a gate electrode 129A thereof in a phase of start of the exposure operation. The electric charge discharging portion 129 further has an operation for preventing the photodiode 121 from being saturated to overflow the electric charges for a period of time for the reading operation after completion of the exposure operation. A predetermined voltage VDA is applied to a drain portion 136 of the electric charge discharging portion 129.

[Potential of Gate Electrode of Memory Portion 123]

Here, a description will now be given with respect to a potential of the gate electrode of the memory portion 123 as the electric charge holding region, that is, the gate electrode 122A of the first transfer gate 122.

In this embodiment, a potential of the gate electrode of the memory portion 123 as the electric charge holding region is set at a potential with which a pinning state is provided for a period of time for which at least one of the first transfer gate 122 and the second transfer gate 124, for example, the first transfer gate 122 is set in a non-conduction state. More specifically, when any one or both of the first transfer gate 122 and the second transfer gate 124 are set in the non-conduction state, the voltages applied to the gate electrodes 122A and 124A, are set so as to provide a pinning state in which the carriers can be accumulated on the Si surface right below each of the gate electrodes 122A and 124A.

As with this embodiment, in the case where the transistor composing the transfer gate is of the N-type, when the first transfer gate 122 is set in the non-conduction stare, the voltage applied to the gate electrode 122A is set as a voltage, which becomes a negative potential lower than the ground GND, for the P-type well layer 132. It is noted that although not illustrated, in the case where the transistor composing the transfer gate is of a P-type, the P-type well layer is replaced with an N-type well layer, and a voltage applied to a gate electrode of that transistor is set a voltage, which is higher than the power source voltage VDD, for the N-type well layer.

The reason that when the first transfer gate 122 is set in the non-conduction state, the voltage applied to the gate electrode 122A is set as the voltage so as to provide the pinning state in which the carriers can be accumulated on the Si surface right below each of the gate electrodes 122A and 124A is described as follows.

When the potential of the gate electrode 122A of the first transfer gate 122 is set as the same potential (for example, 0 V) as that for the P-type well layer 132, there is the possibility that the carriers generated from the crystal defects of the Si surface are accumulated in the memory portion 123 to turn into the dark current, thereby deteriorating the image quality. To this end, in this embodiment, an OFF potential of the gate electrode 122A formed on the memory portion 123 is set as a negative potential, for example, −2.0 V for the P-type well layer 132. As a result, in this embodiment, for the period of time for holding the electric charges, holes can be generated on the Si surface of the memory portion 123, and thus the electrons generated on the Si surface can be recombined with the holes. As a result, it is possible to reduce the dark current.

It is noted that since in the structure and configuration shown in FIG. 6, the gate electrode 124A exists in an end portion of the memory portion 123, the dark current generated in the end portion of the memory portion 123 can be similarly suppressed by giving the gate electrode 124A the negative potential.

With the CMOS image sensor 100, the exposure operation is started simultaneously for all the pixels, the exposure operation is ended simultaneously for all the pixels, and the electric charges accumulated in the photodiode 121 are successively transferred to the memory portion 123 and the floating diffusion region 125 for each of which the light is blocked, thereby realizing the global exposure operation. Since the period of time for the exposure operation for which all the pixels are unanimous is obtained based on the global exposure operation, the image capturing free from the distortion becomes possible.

It is noted that all the pixels in this embodiment mean all the pixels in a portion appearing in an image, and thus a dummy pixel or the like is excluded therefrom. In addition, if a time difference and the distortion of the image are so small as not to become a problem, an operation for scanning the pixels by plural rows (for example, several tens of rows) at a high speed instead of the full-pixel simultaneous operation is also contained in the concept of all the pixels.

[Schematic Cross Sectional View of Unit Pixel]

Figure 7:
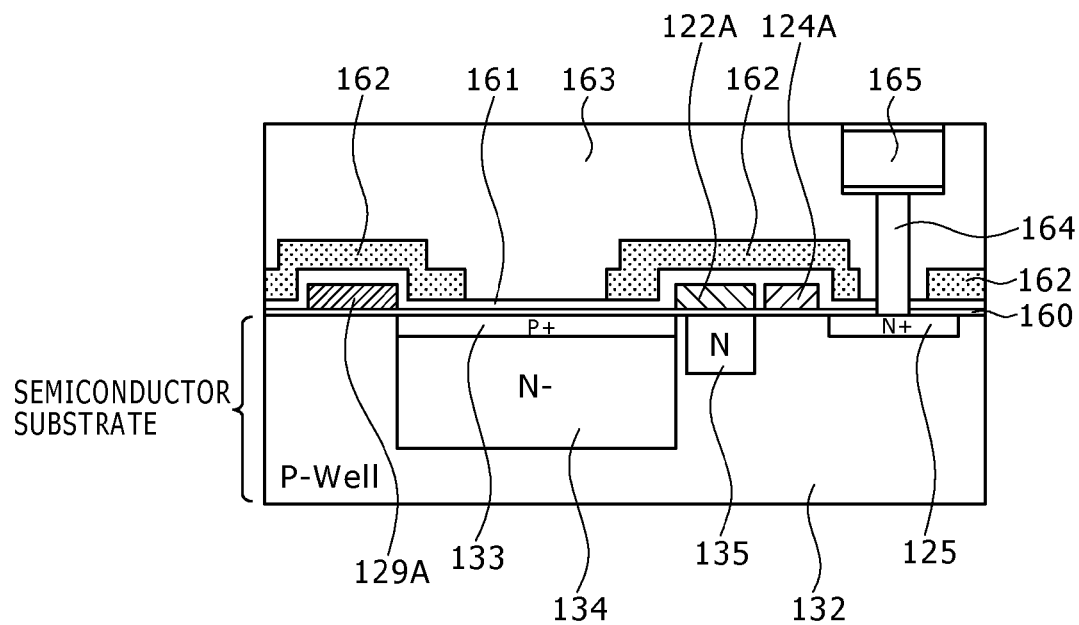
FIG. 7 is a schematic cross sectional view showing the structure of the unit pixel.

FIG. 7 is a schematic cross sectional view of the unit pixel 120. A description will now be given with respect to a film structure on the upper side with respect to the semiconductor substrate of the unit pixel 120 with reference to FIG. 7. Here, the semiconductor substrate means the entire portion composed of the N-type substrate 131, and the P-type well layer 132 including the P$^+$-type layer 133, the N$^-$-type buried layer 134, the buried channel 135, and the buried region of the floating diffusion region 125 which are all formed inside the N-type substrate 131.

It is noted that in FIG. 7, a part of the constituent elements shown in FIG. 6 is omitted in illustration, and portions corresponding to those of FIG. 6 are designated by the same reference numerals or symbols. Thus, a description duplicating that of FIG. 6 will be suitably omitted below.

A thermal oxide film 160 is formed on an upper surface of the semiconductor substrate. Also, gate electrodes 122A, 124A and 129A are formed on the thermal oxide film 160. The thermal oxide film 160 insulates impurity regions each underlying the thermal oxide film 160, and the gate electrodes 122A, 124A and 129A from each other.

Also, an insulating film 161 is formed on upper surfaces of the gate electrodes 122A, 124A and 129A, and the thermal oxide film 160. In addition, a light blocking film (tungsten oxide film) 162 and a planarizing film 163 are formed in this order on an upper surface of the insulating film 161 in a lamination fashion.

It is noted that although an illustration is omitted, a color filter with which an R pixel is made to pass only a light in a wavelength region of R, a G pixel is made to pass only a light in a wavelength region of G, and a B pixel is made to pass only a light in a wavelength region of B is disposed on an upper surface of the planarizing film 163. Therefore, only the light having the wavelength region of R is made incident to the $N^-$-type buried layer 134 of the R pixel, only the light having the wavelength region of G is made incident to the $N^-$-type buried layer 134 of the G pixel, and only the light having the wavelength region of B is made incident to the $N^-$-type buried layer 134 of the B pixel.

For making the light incident, the light blocking film 162 is not provided on the upper portion of the $N^-$-type buried layer 134. In addition, the upper portion of the $N^-$-type buried layer 134 is opened because a contact 164 through which a wiring layer 165 and the floating diffusion region 125 are connected to each other is disposed.

[Structure of Insulating Film 161]

A structure of the insulating film 161 of the unit pixel 120 will be described below with reference to FIGS. 8A and 8B.

Figure 8A:
FIGS. 8A and 8B are a cross sectional view and a view, respectively, each explaining a structure of an insulating film.

In this embodiment, as shown in FIG. 8A, the insulating film 161 has a three layer structure including a first oxide film (LP-TEOS oxide film, LP-TEOS stands for Low Pressure TEOS) 171, a nitride film 172, and a second oxide film (TEOS oxide film, TEOS stands for Tetraethoxysilane) 173 from a side close to the semiconductor substrate.

The first oxide film 171 is provided for the purpose of obtaining excellent adhesion with the nitride film 172. The second oxide film 173 is provided for the purpose of obtaining excellent adhesion with the light blocking film 162. Also, the nitride film 172 is provided for the antireflection.

Figure 8B:
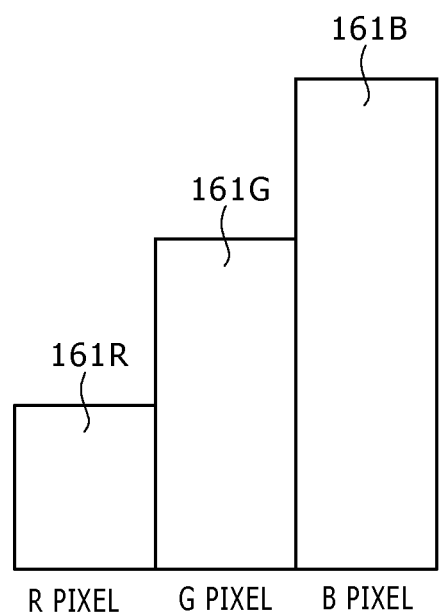

In addition, in this embodiment, as shown in FIG. 8B, the insulating film 161 is structured so as to differ in thickness thereof depending on the R, G and B pixels. That is to say, a thickness of the insulating film 161R of the R pixel is smallest, a thickness of the insulating film 161G of the G pixel is second-smallest, and a thickness of the insulating film 161B of the B pixel is largest (the thickness of the insulating film 161R<the thickness of the insulating film 161G<the thickness of the insulating film 161B).

As the thickness of the insulating film 161 is made smaller, a quantity of light is reduced which is diffracted between the light blocking film 162 and the P-type layer 133 (semiconductor substrate) to be leaked to the buried channel 135. Therefore, in this embodiment, the more the pixel is concerned to which a large quantity of light having the long wavelength region is leaked to be made incident when the thickness of the insulating films of the R, G and B pixels are unified, the more the thickness of the insulating film 161 is reduced. As a result, it is possible to suppress the leaked signal suppression ratio in each of the R, G and B pixels. In addition, the thicknesses of the insulating film 161R, the insulating film 161G and the insulating film 161B are suitably set, whereby the leaked signal suppression ratios can be uniformed in the R, G and B pixels.

[Method of Manufacturing Unit Pixel 120]

A method of manufacturing the insulating films 161 having the different thicknesses in the R, G and B pixels will be described below with reference to FIG. 9.

In Step S1, a process for forming the insulating films 161 which are uniform in all the R, G and B pixels is carried out.

Next, in Step S2, a process for adjusting the insulating film 161 of the G pixel is carried out. That is to say, there is carried out the process in which with each of the thicknesses of the insulating films 161 formed in Step S1 as the largest thickness of the insulating film 161B of the B pixel, the insulating film 161 of the G pixel is made thinner than the insulating film 161B of the B pixel, thereby forming the insulating film 161G of the G pixel.

In addition, in Step S3, a process for adjusting the insulating film 161 of the R pixel is carried out. That is to say, there is carried out the process in which the insulating film 161 formed in Step S1 is made thinner than the insulating film 161 of the G pixel, thereby forming the insulating film 161R of the R pixel.

The insulating film 161 meeting the relationship of "the thickness of the insulating film 161R<the thickness of the insulating film 161G<the thickness of the insulating film 161B" can be formed in the manner as described above.

The process for forming the insulating film 161G of the G pixel in Step S2 of FIG. 9 will be described below with reference to FIGS. 10A to 10E.

Figure 9:
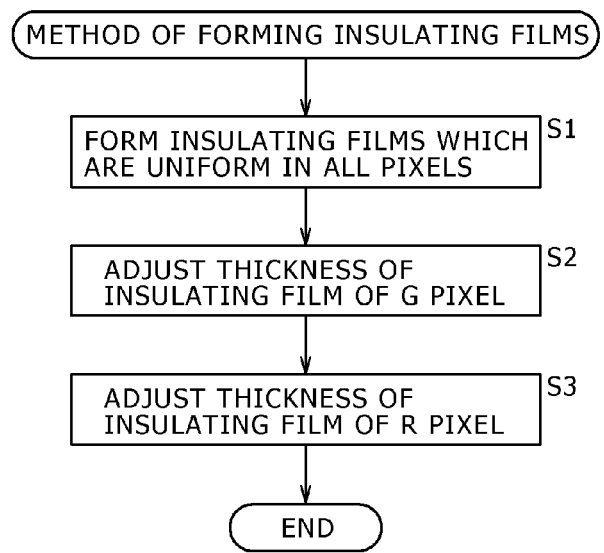
FIG. 9 is a flow chart explaining a method of forming the insulating films.
Figure 10A:
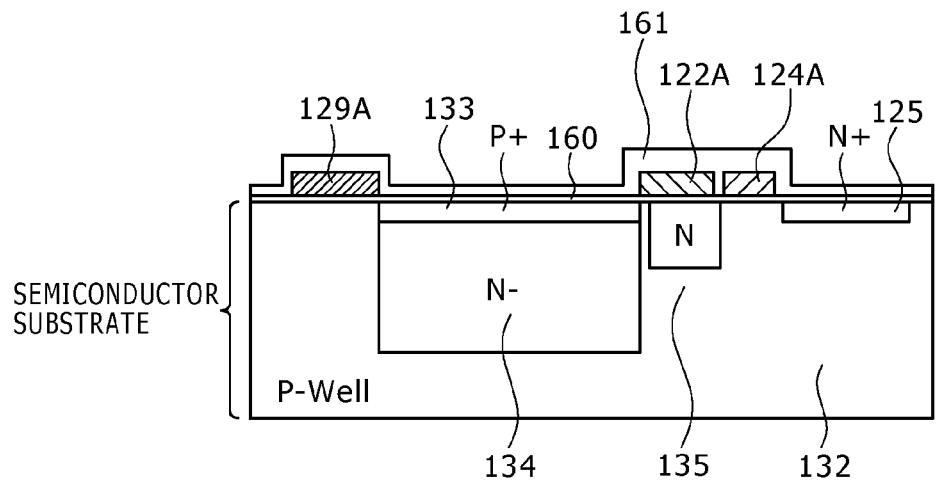
FIGS. 10A to 10E are cross sectional views explaining processes for manufacturing an insulating film of a G pixel.

FIG. 10A shows a state of the G pixel at a time point when Step S1 of FIG. 9 is ended. That is to say, in the state shown in FIG. 10A, the thickness of the insulating film 161G of the G pixel is the same as that of the insulating film 161B of the B pixel.

Figure 10B:
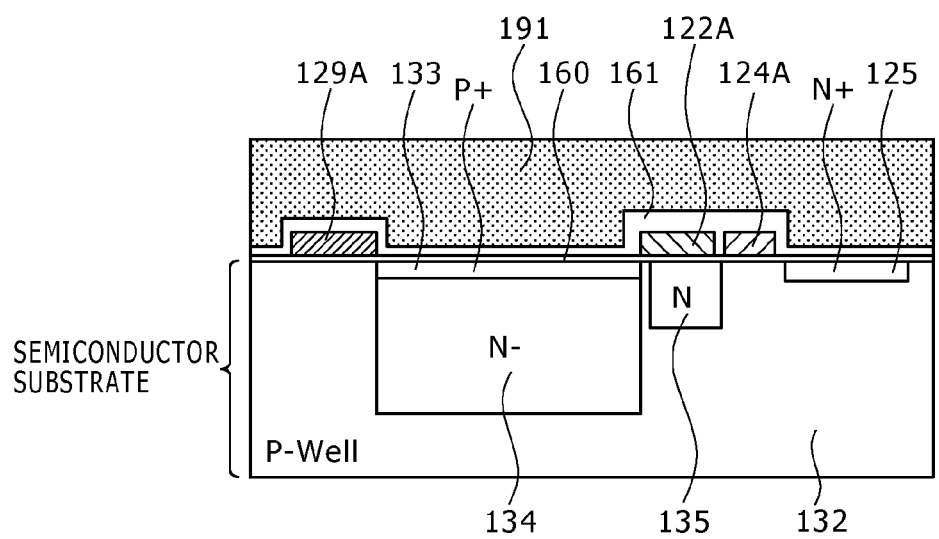

From the state shown in FIG. 10A, firstly, as shown in FIG. 10B, a photo resist 191 is applied onto the insulating film 161 for all the R, G and B pixels so as to have a predetermined thickness. In this embodiment, the photo resist is of a positive type.

Figure 10C:
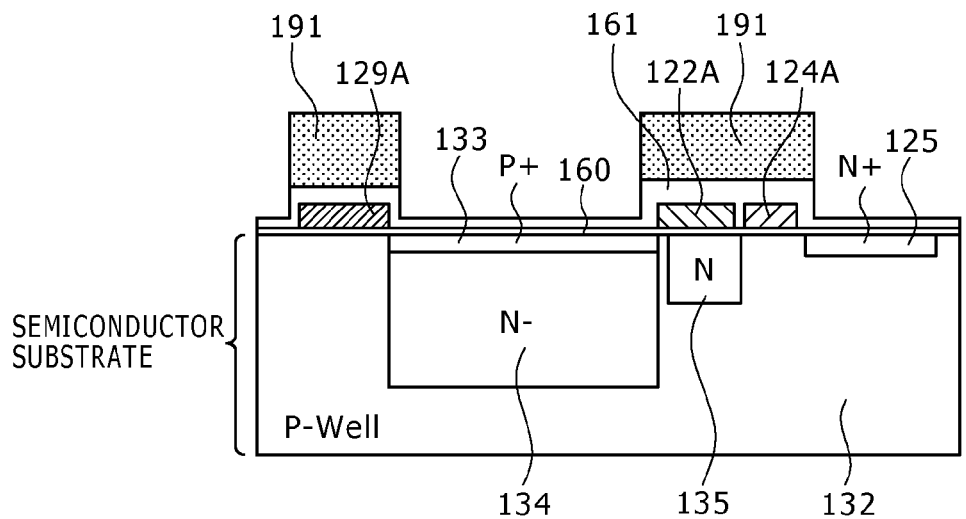
Figure 10D:
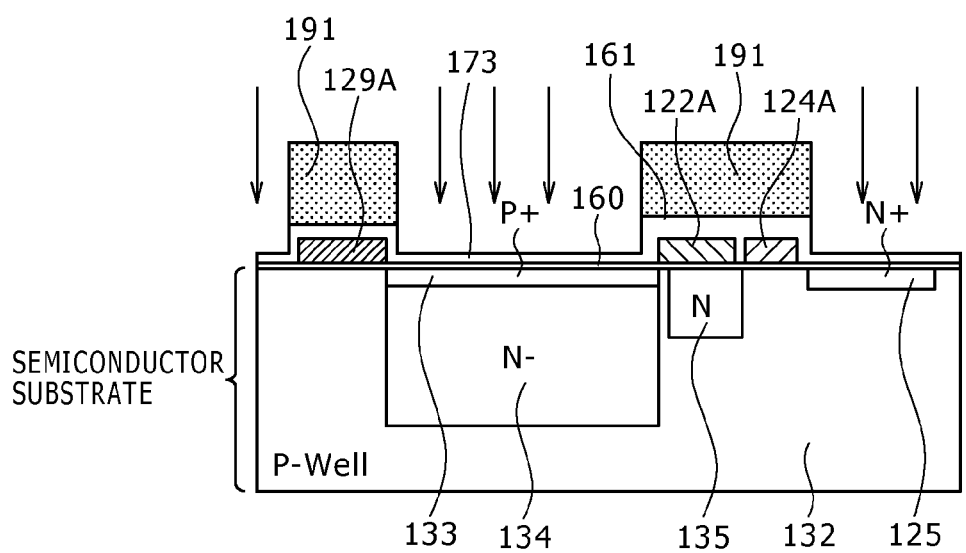

Also, by carrying out an exposure treatment and a development treatment, as shown in FIG. 10C, a region excluding upper surfaces of the gate electrodes 122A, 124A and 129A in a region of the G pixel is opened.

Subsequently, as shown in FIG. 11D, a second oxide film 173 as a part of the insulating film 161 exposed to the opening portion of the photo resist 191 is selectively etched away. By carrying out this etching, a thickness of the insulating film 161G of the G pixel is made smaller than that of the insulating film 161B of the B pixel. Here, when an image having high image quality is required for the CMOS image sensor 100, that is, when the thickness of the insulating films 161 of the R, G and B pixels are desired to be controlled with high accuracy, wet etching with which less damage is provided can be adopted, and dry etching can be adopted in any other case.

Figure 10E:
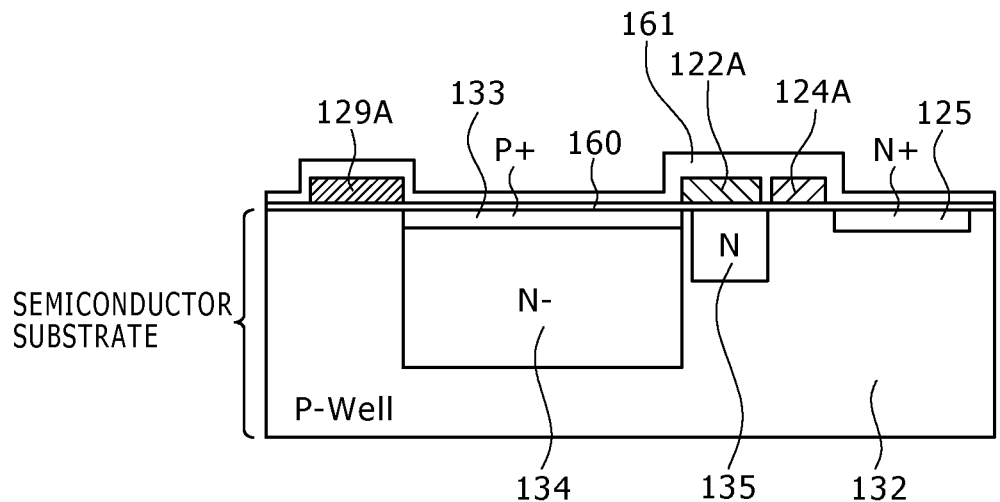

Finally, as shown in FIG. 10E, the photo resist 191 is peeled off, thereby completing the process for forming the insulating film 161G of the G pixel.

In Step S3 of FIG. 9, the insulating film 161R of the R pixel can also be formed in the same procedure as that described with reference to FIGS. 10B to 10E. However, opening regions of photo resist masks (photo masks) which are used are different between the R pixel and the G pixel.

It is noted that although in the flow chart shown in FIG. 9, the insulating film 161R of the R pixel is adjusted after the insulating film 161G of the G pixel is adjusted, the order of the adjustment of the G pixel, and the adjustment of the R pixel may also be reversed.

The difference among the thicknesses of the insulating films 161 of the R, G and B pixels, for example, can be made to fall within ±20% with the thickness of the insulating film 161G of the G pixel, as an intermediate thickness, as a reference. Specifically, when the thickness of the insulating film 161G of the G pixel is set as 50 nm, the thickness of the insulating film 161B of the B pixel, and the thickness of the insulating film 161R of the R pixel can be set as 60 nm and 40 nm, respectively. It is noted that when at least the relationship of "the thickness of the insulating film 161R<the thickness of the insulating film 161G<the thickness of the insulating film 161B" is met, the leaked signal suppression ratio can be suppressed in each of the R, G and B pixels.

In addition, the thickness of the insulating film 161R of the R pixel may be identical to that of the insulating film 161G of the G pixel, and may be smaller than that of the insulating film 161B of the B pixel, or the thickness of the insulating film 161B of the B pixel may be identical to that of the insulating film 161G of the G pixel, and may be smaller than that of the insulating film 161R of the R pixel. Even in this case, the leaked signal suppression ratio can be suppressed as compared with the existing case.

With the method of manufacturing the insulating films described with reference to FIG. 9, of the three layers, that is, the first oxide film 171, the nitride film 172 and the second oxide film 173 composing the insulating film 161, the second oxide film 173 is etched, thereby adjusting the thickness of the insulating film 161. However, the first oxide film 171 or the nitride film 172 may be etched, thereby adjusting the thickness of the insulating film 161. In this case, after completion of the formation of either the first oxide film 171 or the nitride film 172, it is only necessary to adjust the thickness of the insulating film 161 in accordance with the same procedure as that described with reference to FIG. 10B to 10E. However, when the thickness of the nitride film 172 is changed depending on the R, G and B pixels, since the reflectivity is changed depending on the R, G and B pixels, preferably, either the thickness of the first oxide film 171 or the thickness of the second oxide film 173 is changed.

In addition, instead of adjusting the thickness of the insulating film 161, the thermal oxide film 160 may be formed so as to be thin in the order of the R, G and B pixels. In this case as well, it is possible to suppress the leaked signal suppression ratio.

In addition, the insulating film 161 may also be composed of either two layers of the first oxide film 171 and the nitride film 172, or the nitride film 172 and the second oxide film 173, or one layer of the first oxide film 171, the second oxide film 173 or the nitride film 172. In this case as well, at least one layer is formed so as to be thin in the order of the R, G and B pixels, thereby making it possible to suppress the leaked signal suppress ratio.

Since the pixel signal outputted from the column processing portion 113 of the CMOS image sensor 100 adopting the unit pixel 120 as described above is the signal in which the coloring caused by the locus-like noise is suppressed, it is unnecessary to correct the coloring in the signal processing portion 118 or the like in the subsequent stage. Therefore, it is possible to provide the solid-state image pickup element in which the coloring caused by the locus-like noise is inexpensively suppressed.

[Other Structures of Unit Pixel]

The present invention can adopt even other suitable unit pixels other than the unit pixel 120 described in the first embodiment as long as each of them has a light blocking layer in terms of a structure of the unit pixel (solid-state image pickup element). Hereinafter, a description will be given with respect to structures of other unit pixels of the unit pixel 120 to each of which an embodiment of the present invention can be applied. It is noted that in the following description, portions corresponding to those shown in FIG. 6 are designated by the same reference numerals or symbols, and a description thereof is suitably omitted.

[First Structure of Other Structures of Unit Pixel]

Figure 11:
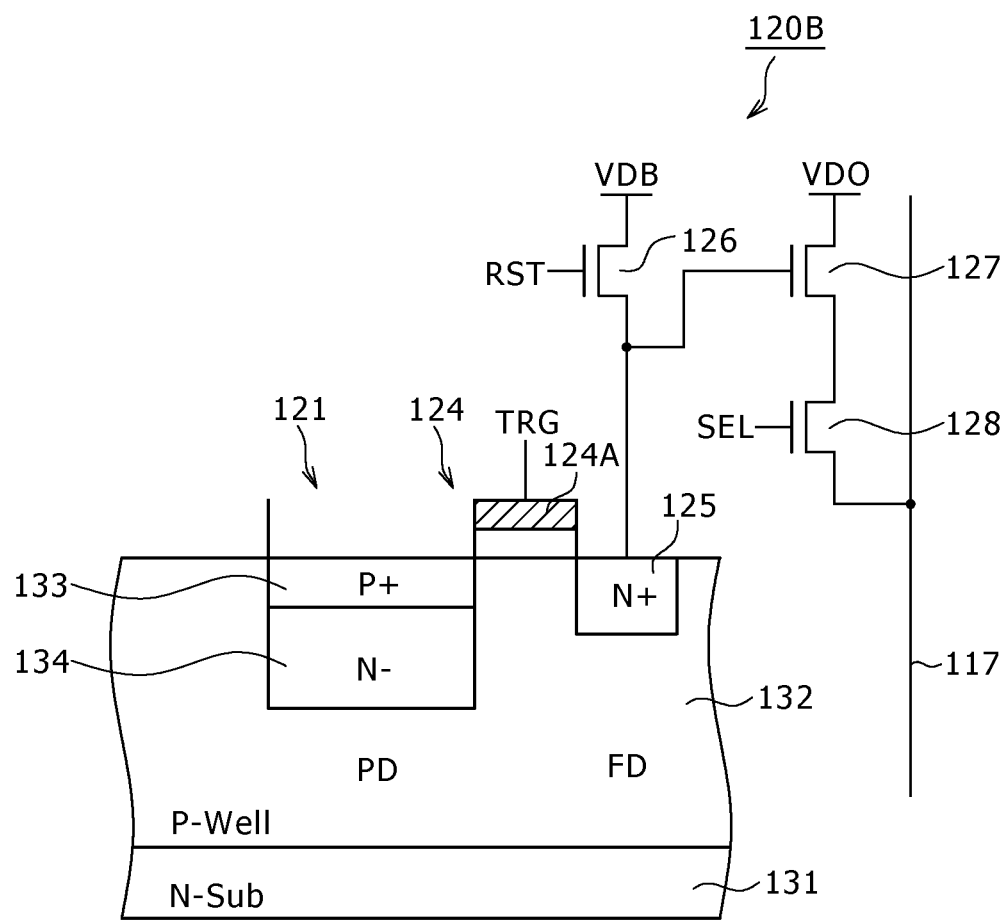
FIG. 11 is a cross sectional view, partly in circuit, showing a first structure of other structures of the unit pixel.

FIG. 11 is a cross sectional view, partly in circuit, showing a structure and a configuration of a unit pixel 120B as a first structure of other structures of the unit pixels 120.

In the unit pixel 120B, both the first transfer gate 122 and the memory portion 123 in the unit pixel 120 shown in FIG. 6 are omitted, and the photodiode 121 and the floating diffusion region 125 are disposed adjacent to each other through the P-type well layer 132. The second transfer gate 124 is disposed on the upper side of a portion of the P-type well layer 132 between the photodiode 121 and the floating diffusion region 125.

A description will now be given with respect to the global exposure operation in the unit pixel 120B. Firstly, after the electric charge discharging operation for emptying out the electric charges accumulated in the buried photodiode 121 is executed in the full-pixel simultaneous manner, the exposure operation is started. As a result, the optical electric charges are accumulated in a PN junction capacitor of the photodiode 121. At a time point of completion of the period of time for the exposure operation, the second transfer gate 124 is turned ON in the full-pixel simultaneous manner, and all the optical electric charges accumulated in the PN junction capacitor of the photodiode 121 are transferred to the floating diffusion region 125. By closing the second transfer gate 124, the optical electric charges accumulated for the period of time for the exposure operation in the full-pixel simultaneous manner are held in the floating diffusion region 125. After that, the optical electric charges held in the floating diffusion region 125 are successively read out as the image signal through the vertical signal line 117. Finally, the floating diffusion region 125 is reset, and thereafter, the reset level is read out.

Therefore, in the unit pixel 120B, the floating diffusion region 125 becomes the electric charge holding region when the global exposure operation is carried out. In the unit pixel 120B, similarly to the case of the unit pixel 120, the thickness of the insulating film formed on the upper surfaces of the P-type layer 133 and the gate electrode 124A can be changed depending on the R, G and B pixels in the manner as described above, and thus the present invention can be applied thereto. It is noted that when it is unnecessary to carry out the global exposure operation, the floating diffusion region 125 may be shared among plural pixels.

[Second Structure of Other Structures of Unit Pixel]

Figure 12:
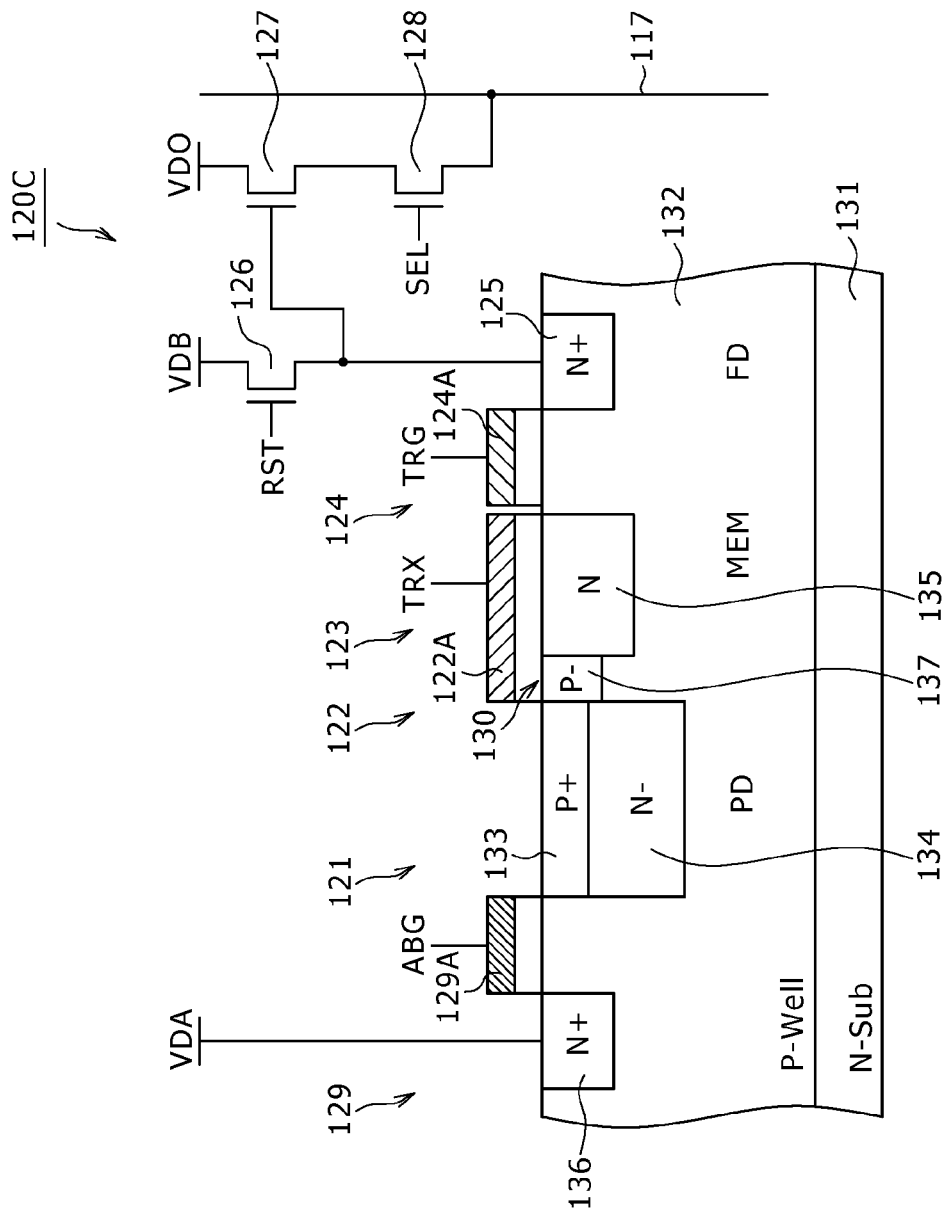
FIG. 12 is a cross sectional view, partly in circuit, showing a second structure of other structures of the unit pixel.

FIG. 12 is a cross sectional view, partly in circuit, showing a structure and a configuration of a unit pixel 120C as a second structure of other structures of the unit pixel 120.

The unit pixel 120C is different from the unit pixel 120 in that a P⁻-type impurity diffusion region 137 is provided under the gate electrode 122A, that is, in a boundary portion between the photodiode 121 and the memory portion 123, thereby forming an overflow path 130.

In order to form the overflow path 130, it is necessary to lower a potential of the impurity diffusion region 137. The impurity diffusion region 137 is lightly doped with an N-type impurity to reduce a P⁻-type impurity concentration, thereby making it possible to form the P⁻-type impurity diffusion region 137. Or, in the case where the impurity diffusion region 137 is doped with a P-type impurity when a potential barrier is formed, the P⁻-type impurity diffusion region 137 can be formed by reducing the concentration of the impurity diffusion region 137.

In the unit pixel 120C, the overflow path 130 formed in the boundary portion between the photodiode 121 and the memory portion 123 is used as a section for preferentially accumulating the electric charges generated at a low luminance in the photodiode 121.

The P⁻-type impurity diffusion region 137 is provided in the boundary portion between the photodiode 121 and the memory portion 123, thereby lowering a potential of the boundary portion. A portion in which this potential is lowered becomes the overflow path 130. Also, the electric charges which are generated in the photodiode 121 and exceed the potential of the overflow path 130 are automatically leaked to the memory portion 123 to be accumulated in the memory portion 123. In other words, the electric charges which are generated in the photodiode 121 and not greater than the potential of the overflow path 130 are accumulated in the photodiode 121.

The overflow path 130 has a function as an intermediate electric charge transferring portion. That is to say, the overflow path 130 serving as the intermediate electric charge transferring portion transfers the electric charges which are generated in the photodiode 121 by the photoelectric conversion for a period of time for exposure operation for which all the plural unit pixels carry out simultaneously the image capturing operations, and whose amount exceeds a predetermined amount of electric charges depending on the potential of the overflow path 130 in the form of the signal electric charges to the memory portion 123.

It is noted that in the second structure shown in FIG. 12, there is adopted the structure that the P⁻-type impurity diffusion region 137 is provided, thereby forming the overflow path 130. However, it is also possible to adopt a structure that an N⁻-type impurity diffusion region 137 is provided instead of providing the P⁻-type impurity diffusion region 137, thereby forming the overflow path 30.

In the unit pixel 120C, both the floating diffusion region 125 and the buried channel 135 become the electric charge holding region when the global exposure operation is carried out. In the unit pixel 120C, similarly to the case of the unit pixel 120, the thickness of the insulating film formed on the upper surfaces of the P-type layer 133 and the gate electrode 124A can be changed depending on the R, G and B pixels in the manner as described above, and thus an embodiment of the present invention can be applied thereto.

[Third Structure of Other Structures of Unit Pixel]

Figure 13:
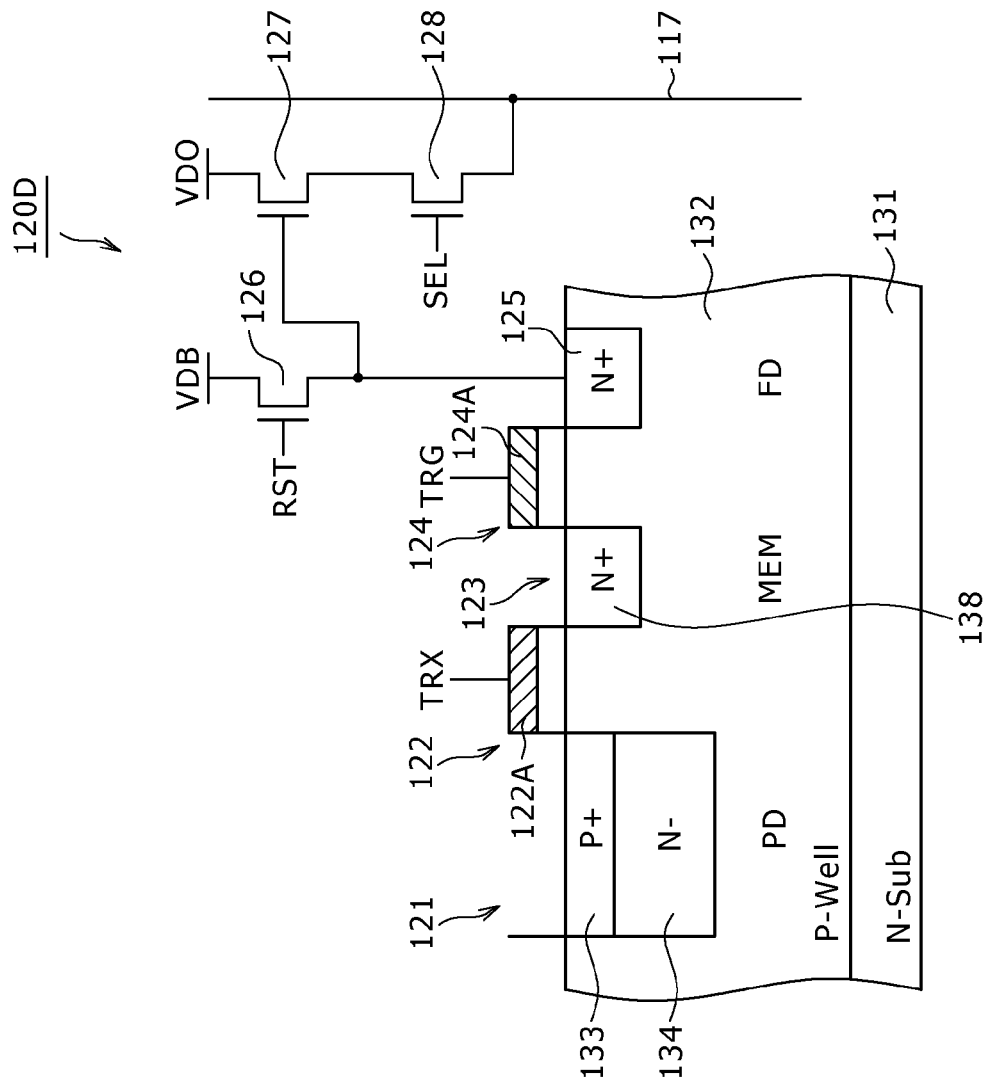
FIG. 13 is a cross sectional view, partly in circuit, showing a third structure of other structures of the unit pixel.

FIG. 13 is a cross sectional view, partly in circuit, showing a structure and a configuration of a unit pixel 120D as a third structure of other structures of the unit pixel 120.

The unit pixel 120D has a structure that a memory portion 123 similar to the floating diffusion region 125 is provided in the structure of the unit pixel 120B shown in FIG. 11. That is to say, in the unit pixel 120D, the gate electrode 122A of the first transfer gate 122 is provided above the P-type well layer 132 in the boundary between the photodiode 121 and the memory portion 123. In addition, in the unit pixel 120D, the memory portion 123 is composed of an N⁺-type layer 138 similar to the N⁺-type floating diffusion region 125.

The global exposure operation in the unit pixel 120D is carried out in accordance with the following procedure. Firstly, the electric charges discharging operation is carried out simultaneously for all the pixels, thereby starting the simultaneous exposure operation. The optical electric charges generated are accumulated in the photodiode 121. At a time point of completion of the exposure operation, the first transfer gate 122 is turned ON simultaneously for all the pixels, and the optical electric charges accumulated in the photodiode 121 are transferred to the memory portion 123 to be held therein. After completion of the exposure operation, both the reset level and the signal level are read out in accordance with the sequential operation. That is to say, the floating diffusion region 125 is reset, and the reset level is next read out. Subsequently, the electric charges held in the memory portion 123 are transferred to the floating diffusion region 125, and thus the signal level is read out.

In the unit pixel 120D, the N⁺-type layer 138 of the memory portion 123 becomes the electric charge holding region when the global exposure operation is carried out. In the unit pixel 120D, similarly to the case of the unit pixel 120, the thickness of the insulating film formed on the upper surfaces of the P-type layer 133 and the gate electrode 124A can be changed depending on the R, G and B pixels in the manner as described above, and thus an embodiment of the present invention can be applied thereto.

[Fourth Structure of Other Structure of Unit Pixel]

Figure 14:
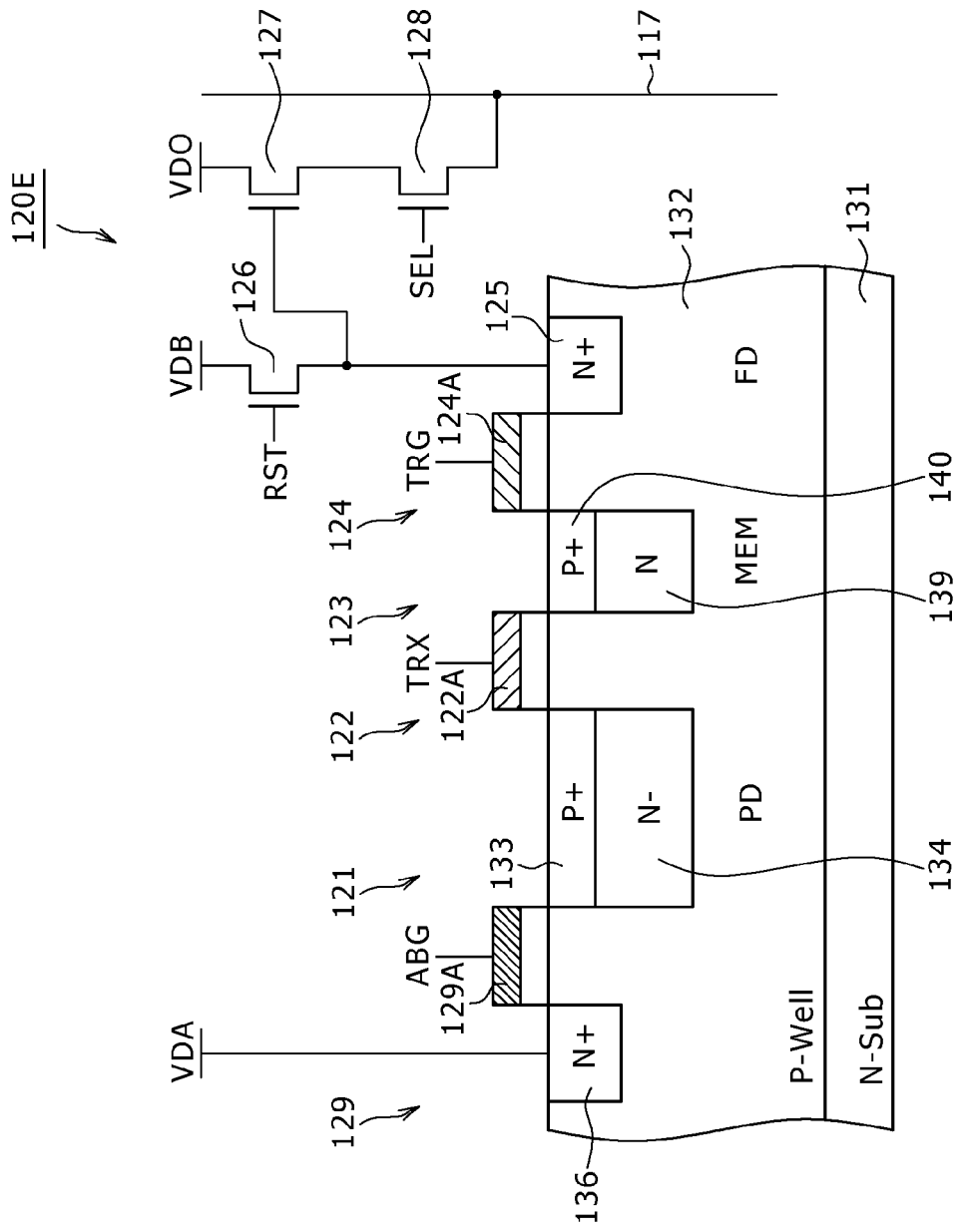
FIG. 14 is a cross sectional view, partly in circuit, showing a fourth structure of other structures of the unit pixel.

FIG. 14 is a cross sectional view, partly in circuit, showing a structure and a configuration of a unit pixel 120E as a fourth structure of other structures of the unit pixel 120.

In the unit pixel 120E shown in FIG. 14, there is adopted a structure that the memory portion 123 is composed of a buried N-type diffusion region 139 instead of being composed of the N-type buried channel 135.

Even when the memory portion 123 is composed of the N-type diffusion region 139, it is possible to obtain the same operation and effect as those when the memory portion 123 is composed of the N-type buried channel 135. Specifically, the N-type diffusion region 139 is formed inside the P-type well layer 132, and a P⁺-type layer 140 is formed on the substrate surface side, whereby it is possible to prevent the dark current generated in the interface from being accumulated in the N-type diffusion region 139 of the memory portion 123. As a result, this can contribute to the enhancement of the image quality.

Here, preferably, an impurity concentration of the N-type diffusion region 139 of the memory portion 123 is made lower than that of the N⁺-type floating diffusion region 125. Such setting of the impurity concentration makes it possible to enhance the efficiency of the transferring the electric charges from the memory portion 123 to the N⁺-type floating diffusion region 125 by the second transfer gate 124. The global exposure operation in the unit pixel 120E is identical to that in the unit pixel 120 shown in FIG. 6.

Note that, with the structure of the unit pixel 120E shown in FIG. 14, the memory portion 123 is composed of the buried N-type diffusion region 139. In this case, however, a structure that is not of the buried type may also be adopted although the dark current generated in the memory portion 123 is increased in some cases.

In the unit pixel 120E, the N-type diffusion 139 of the memory portion 123 becomes the electric charge holding region when the global exposure operation is carried out. In the unit pixel 120E, similarly to the case of the unit pixel 120, the thickness of the insulating film formed on the upper surfaces of the P-type layer 133 and the gate electrode 122A can be changed depending on the R, G and B pixels in the manner as described above, and thus the present invention can be applied thereto.

[Fifth Structure of Other Structures of Unit Pixel]

Figure 15:
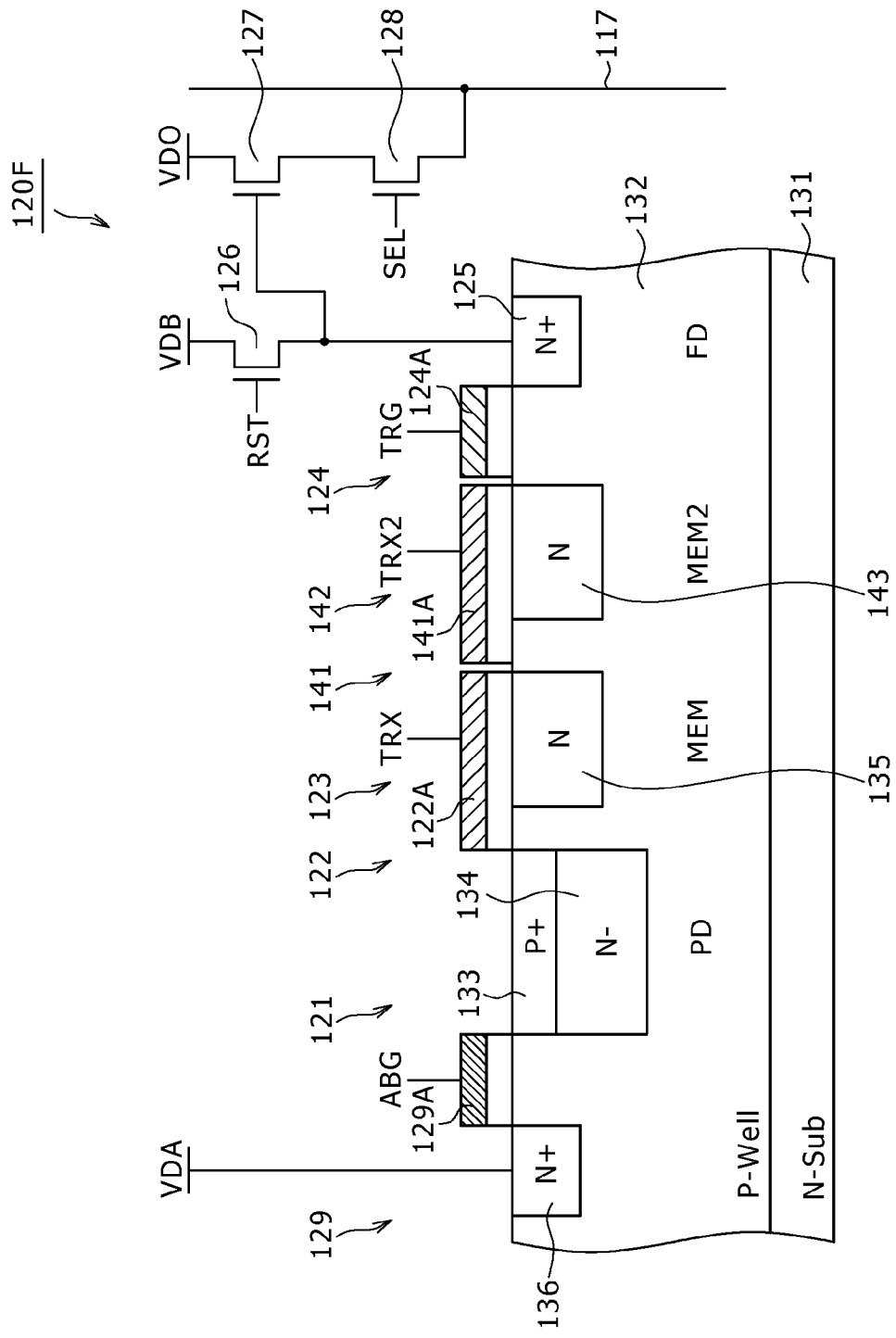
FIG. 15 is a cross sectional view, partly in circuit, showing a fifth structure of other structures of the unit pixel.

FIG. 15 is a cross sectional view, partly in circuit, showing a structure and a configuration of a unit pixel 120F as a fifth structure of other structures of the unit pixel 120.

In the unit pixel 120 shown in FIG. 6, one memory portion (MEM) 123 is disposed between the photodiode 121 and the floating diffusion region 125. On the other hand, in the unit pixel 120F shown in FIG. 15, another memory portion (MEM2) 142 is further disposed. That is to say, the memory portion has a two stage structure.

A third transfer gate 141 transfers the electric charges accumulated in the memory portion 123 by applying a transfer pulse TRX2 to a gate electrode 141A thereof. The memory portion 142 is composed of an N-type buried channel 143 formed below the gate electrode 141A, and holds the electric charges transferred thereto from the memory portion 123 by the third transfer gate 141. Since the memory portion 142 is composed of the N-type buried channel 143, it is possible to suppress the generation of the dark current in the interface. As a result, this can contributes the enhancement of the image quality.

Since the memory portion 142 has the same structure as that of the memory portion 123, when the modulation is applied to the memory portion 142 similarly to the case of the memory portion 123, an amount of saturated electric charges in the memory portion 142 can be increased as compared with the case where no modulation is applied to the memory portion 142.

In the global exposure operation in the unit pixel 120F, the optical electric charges accumulated simultaneously for all the pixels are held either in the photodiode 121 or in the memory portion 123. The memory portion 142 is used to hold the optical electric charges until the pixel signal is read out.

In the unit pixel 120F, both the N-type buried channel 135 of the memory portion 123, and the N-type buried channel 143 of the memory portion 142 become the electric charge holding region when the global exposure operation is carried out. In the unit pixel 120F, similarly to the case of the unit pixel 120, the thickness of the insulating film formed on the upper surfaces of the P-type layer 133 and the gate electrode 122A can be changed depending on the R, G and B pixels in the manner as described above, and thus the present invention can be applied thereto.

As has been described, the present invention can also be adopted in any other suitable structure other than the unit pixel 120. In addition, an embodiment of the present invention can be similarly applied to the case where the polarity (N-type or P-type) of the conductivity type is reversed in each of the unit pixels 120, and 120B to 120F.

[Configuration of Electronic Apparatus to which the Present Invention is Applied]

Moreover, the present invention is by no means limited to the application to the solid-state image pickup element. That is to say, the present invention can be applied to electronic apparatuses, in all fields, in each of which the solid-state image pickup element is used in an image taking-in portion (photoelectric conversion portion). In this case, such electronic apparatuses in all the fields are typified by an image pickup apparatus such as a digital still camera or a video camera, mobile terminal equipment having an image capturing function, and a copy machine in which the solid-state image pickup element is used in an image reading portion. The solid-state image pickup element may have a form in which the solid-state image pickup element is formed as one chip, or may have a module-like form which has an image capturing function and into which an image capturing portion and a signal processing portion or an optical system are collectively packaged.

Figure 16:
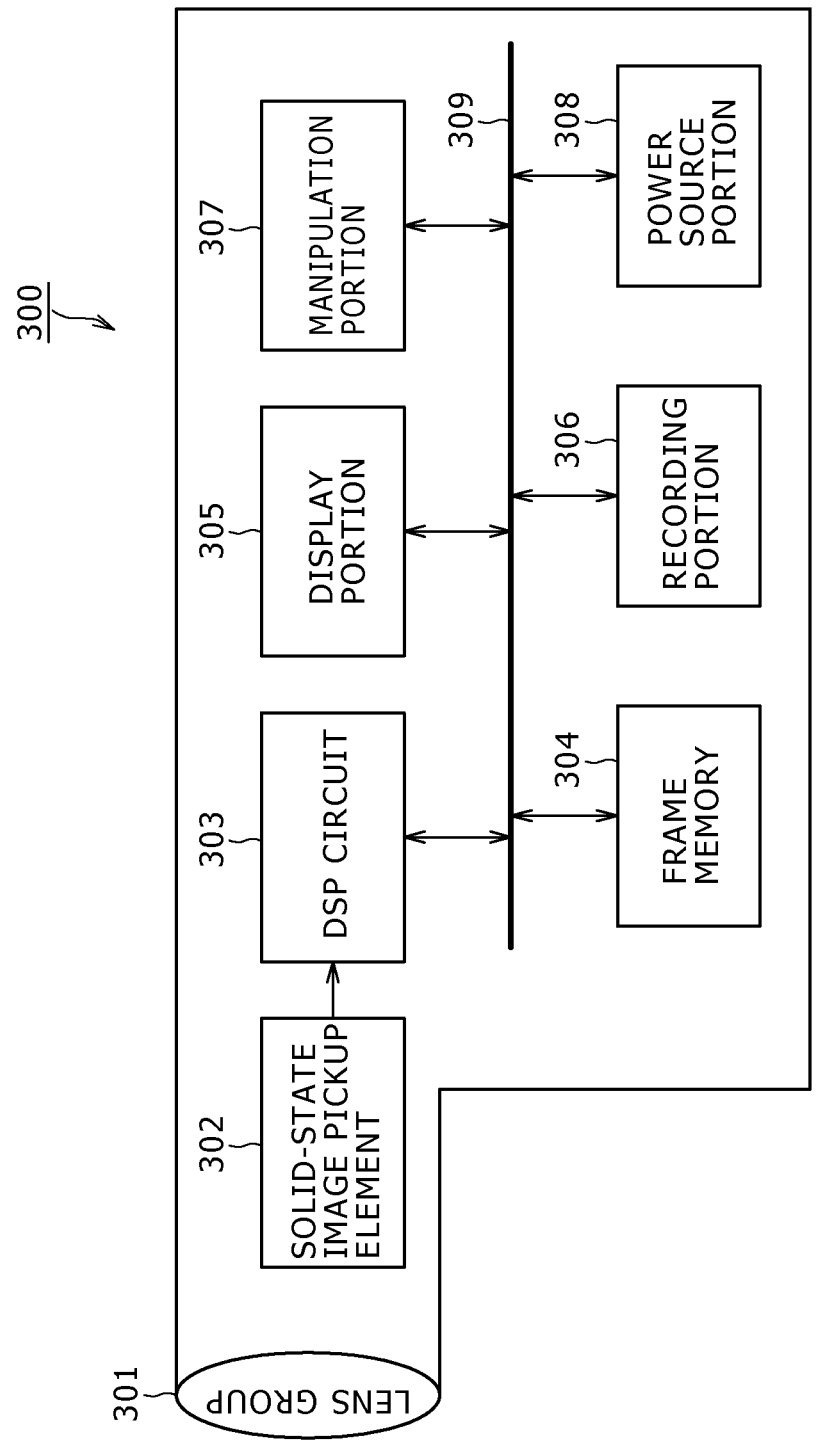
FIG. 16 is a block diagram showing a configuration of an image pickup apparatus as an electronic apparatus according to another embodiment of the present invention.

FIG. 16 is a block diagram showing a configuration of an image pickup apparatus as an electronic apparatus according to another embodiment of the present invention.

The image pickup apparatus 300 shown in FIG. 16 includes an optical portion 301 composed of a lens group and the like, a solid-state image pickup element (image pickup device) 302 in which the constituent elements of the unit pixel 120 are adopted, and a Digital Signal Processor (DSP) circuit 303 as a camera signal processing circuit. In addition, the image pickup apparatus 300 also includes a frame memory 304, a display portion 305, a recording portion 306, a manipulation portion 307, and a power source portion 308. The DSP circuit 303, the frame memory 304, the display portion 305, the recording portion 306, the manipulation portion 307, and the power source portion 308 are connected to one another through a bus line 309.

The optical portion 301 takes in an incident light (image light) from a subject, and forms an image corresponding to the incident light on an imaging area of the solid-state image pickup element 302. The solid-state image pickup element 302 converts a quantity of incident light imaged on the imaging area of the solid-state image pickup element 302 by the optical portion 301 into an electrical signal, and outputs the resulting electrical signal as an image signal. A solid-state image pickup element of the CMOS image sensor 100, that is, a solid-state image pickup element in which it is possible to realize the image capturing free from the distortion by carrying out the global exposure operation, and it is possible to suppress the leaked signal suppression ratio for each of the R, G and B pixels can be used as the solid-state image pickup element 302.

The display portion 305, for example, is composed of a panel type display device such as a liquid crystal panel or an organic Electro Luminescence (EL) panel, and displays thereon either a moving image or a still image captured by the solid-state image pickup element 302. The recording portion 306 records data either on the moving image or on the still image captured by the solid-state image pickup element 302 in a recording medium such as a video tape or a Digital Versatile Disk (DVD).

The manipulation portion 307 issues manipulation commands about various kinds of functions which the image pickup apparatus 300 has in accordance with the manipulation made by a user. The power source portion 308 suitably supplies various kinds of power sources becoming operation power sources for the DSP circuit 303, the frame memory 304, the display portion 305, the recording portion 306, and the manipulation portion 307 to these objects of the supply.

As has been described, the CMOS image sensor 100 of the embodiment is used as the solid-state image pickup element 302, whereby it is possible to realize the image capturing free from the distortion by carrying out the global exposure operation, and it is possible to suppress the leaked signal suppression ratio for each of the R, G and B signals. In particular, in the case of the MEM holding type, although the electric charges can be held for a predetermined period of time in the electric charges holding portion in the vicinity of the light receiving portion in the subsequent stage in the column direction, even in this case, it is possible to suppress the generation of the excessive electric charge due to the light leakage. Therefore, the high image quality promotion for the captured image can be realized even in the image pickup apparatus 300 such as the video camera, the digital still camera, and a camera module for a mobile apparatus such as a mobile phone.

In addition, in the embodiment described above, the description has been given by exemplifying the case where the present invention is applied to the CMOS image sensor in which the unit pixels each of which detects the signal electric charges corresponding to a quantity of visible light as a physical quantity are disposed in a matrix. However, the present invention is by no means limited to the application to the CMOS image sensor, and thus can be applied to the image pickup elements, in all the fields, each using a column system in which a column processing portion is disposed every pixel column in the pixel array portion.

In addition, the present invention is by no means limited to the solid-state image pickup element for detecting a distribution of a quantity of incident visible light to capture the incident visible light as an image. That is to say, the present invention can be applied to a solid-state image pickup element for capturing a distribution of an incidence quantity of infrared ray, X-ray, particles or the like as an image, and solid-state image pickup elements (physical quantity distribution detecting devices) in all fields, such as a fingerprint detecting sensor, for detecting distributions of other physical quantities such as a pressure and an electrostatic capacitance in a broad sense.

The embodiments of the present invention are by no means limited to the embodiments described above, and thus various kinds of changes can be made without departing from the subject matter of the present invention.

The present application contains subject matter related to that disclosed in Japanese Priority Patent Application JP 2010-072498 filed in the Japan Patent Office on Mar. 26, 2010, the entire content of which is hereby incorporated by reference.

What is claimed is:

1. A solid-state imaging device, comprising:
a semiconductor substrate;
a photoelectric conversion region in the semiconductor substrate that generates charges in response to light incident thereon;
an electric charge holding region in the semiconductor substrate and capable of holding electric charges accumulated in the photoelectric conversion region until the electric charges are read out from the electric charge holding region;
a transfer gate that effects transfer of electric charges generated in the photoelectric conversion region to the electric charge holding region;
a light blocking film over an upper surface of the transfer gate; and
an insulating layer over the substrate and between the semiconductor substrate and the light blocking film,
wherein,
a portion of the insulating layer over the photoelectric conversion region is more thinly formed than the insulating layer not over the photoelectric conversion region.

2. The solid-state imaging device of claim 1, wherein the light blocking film overlies the charge holding region.

3. The solid-state imaging device of claim 1, further comprising a charge discharging portion that operative to discharge electric charges from the photoelectric conversion region.

4. The solid-state imaging device of claim 3, wherein the charge discharging portion is at an upper surface of the semiconductor substrate.

5. The solid-state imaging device of claim 1, wherein the semiconductor substrate includes a p-type well, and the charge holding portion comprises an n-type region within the p-type well.

6. The solid-state imaging device of claim 1, comprising a thermal oxide layer between the insulating layer and the semiconductor substrate.

7. The solid-state imaging device of claim 1, wherein the light blocking layer comprises tungsten oxide.

8. The solid-state imaging device of claim 1, wherein the photoelectric conversion region comprises a photodiode.

9. The solid-state imaging device of claim 1, further comprising a floating diffusion region in the semiconductor substrate and a second transfer gate that effects transfer of electric charges from the electric charge holding region to the floating diffusion region.

10. The solid-state imaging device of claim 9, wherein the light blocking film overlies the floating diffusion region and the electric charge holding region.

11. The solid-state imaging device of claim 1, wherein the insulating film has a three layer structure in which a nitride film is sandwiched between a first oxide film and a second oxide film.

12. A solid-state imaging device, comprising:
a semiconductor substrate;
a photoelectric conversion region in the semiconductor substrate that generates charges in response to light incident thereon;
an electric charge holding region in the semiconductor substrate and capable of holding electric charges accumulated in the photoelectric conversion region until the electric charges are read out from the electric charge holding region;
a transfer gate that effects transfer of electric charges generated in the photoelectric conversion region to the electric charge holding region;
a light blocking film over an upper surface of the transfer gate; and
an insulating layer over the substrate and between the semiconductor substrate and the light blocking film,
wherein,
a portion of the insulating layer over the photoelectric conversion region is more thinly formed than the insulating layer not over the photoelectric conversion region,
the light blocking film overlies the charge holding region, and
the semiconductor substrate includes a p-type well, and the charge holding portion comprises an n-type region within the p-type well.

13. The solid-state imaging device of claim 12, further comprising a charge discharging portion that operative to discharge electric charges from the photoelectric conversion region.

14. The solid-state imaging device of claim 12, comprising a thermal oxide layer between the insulating layer and the semiconductor substrate.

15. The solid-state imaging device of claim 12, further comprising a floating diffusion region in the semiconductor substrate and a second transfer gate that effects transfer of electric charges from the electric charge holding region to the floating diffusion region, wherein, the light blocking film overlies the floating diffusion region and the electric charge holding region.

16. A solid-state imaging device, comprising:
a semiconductor substrate;
a photoelectric conversion region in the semiconductor substrate that generates charges in response to light incident thereon;
an electric charge holding region in the semiconductor substrate and capable of holding electric charges accumulated in the photoelectric conversion region until the electric charges are read out from the electric charge holding region;
a first transfer gate that effects transfer of electric charges generated in the photoelectric conversion region to the electric charge holding region,
a floating diffusion region in the semiconductor substrate,
a second transfer gate that effects transfer of electric charges from the electric charge holding region to the floating diffusion region;
a light blocking film over an upper surface of the transfer gate; and
an insulating layer over the substrate and between the semiconductor substrate and the light blocking film,
wherein,
a portion of the insulating layer over the photoelectric conversion region is more thinly formed than the insulating layer not over the photoelectric conversion region,
the light blocking film overlies the electric charge holding region and the floating diffusion region.

17. The solid-state imaging device of claim 16, wherein the semiconductor substrate includes a p-type well, and the charge holding region comprises an n-type region within the p-type well.

18. The solid-state imaging device of claim 16, wherein the insulating layer has a three layer structure in which a nitride film is sandwiched between a first oxide film and a second oxide film.

19. The solid-state imaging device of claim 16, wherein the light blocking film comprises tungsten oxide.

* * * * *